US008194806B2

(12) United States Patent
Okazaki et al.

(10) Patent No.: US 8,194,806 B2
(45) Date of Patent: Jun. 5, 2012

(54) DEMODULATION DEVICE, DEMODULATION DEVICE CONTROL METHOD, DEMODULATION DEVICE CONTROL PROGRAM, AND RECORDING MEDIUM WITH RECORDED DEMODULATION DEVICE CONTROL PROGRAM

(75) Inventors: Mamoru Okazaki, Tenri (JP); Kazumasa Kioi, Hiroshima (JP); Akira Saito, Nara (JP); Masayuki Natsumi, Hiroshima (JP); Atsushi Sakai, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 601 days.

(21) Appl. No.: 12/439,499

(22) PCT Filed: Jul. 5, 2007

(86) PCT No.: PCT/JP2007/063424
§ 371 (c)(1),
(2), (4) Date: Feb. 27, 2009

(87) PCT Pub. No.: WO2008/026376
PCT Pub. Date: Mar. 6, 2008

(65) Prior Publication Data
US 2009/0268856 A1    Oct. 29, 2009

(30) Foreign Application Priority Data

Sep. 1, 2006   (JP) .................................. 2006-238145

(51) Int. Cl.
*H04L 27/08* (2006.01)
(52) U.S. Cl. ........ 375/345; 375/260; 375/316; 375/324; 375/326; 375/340; 375/343; 455/232.1; 455/234.1; 370/210; 370/480

(58) Field of Classification Search .................. 375/260, 375/316, 324, 326, 340, 343, 345; 455/232.1, 455/234.1; 370/210, 480
See application file for complete search history.

(56) References Cited

U.S. PATENT DOCUMENTS

| 6,047,034 A * | 4/2000 | Tsuruoka ...................... 375/343 |
| 6,128,352 A | 10/2000 | Maeda |
| 7,508,459 B2 * | 3/2009 | Mayer et al. .................. 348/731 |

(Continued)

FOREIGN PATENT DOCUMENTS

CN    1329405 A    1/2002

(Continued)

OTHER PUBLICATIONS

Search Report for corresponding European patent application. No. 07768174.0 dated Dec. 1, 2011.

*Primary Examiner* — Leon Flores
(74) *Attorney, Agent, or Firm* — Birch, Stewart, Kolasch & Birch, LLP

(57) ABSTRACT

This demodulation device receives and demodulates a digital broadcast wave. This demodulation device includes an RF search control unit (41) and a GI search control unit (42). The RF search control unit (41) determines whether or not there is a broadcast wave in a certain channel, in accordance with an intensity of a signal outputted from a tuner (12) for receiving a digital broadcast wave. The GI search control unit (42) determines whether or not the broadcast wave is digital, based on whether or not the signal outputted from the tuner (12) contains a guard interval. Thus, the demodulation device is capable of efficiently searching for a channel containing a digital broadcast wave.

12 Claims, 10 Drawing Sheets

U.S. PATENT DOCUMENTS

| | | |
|---|---|---|
| 2002/0021371 A1 | 2/2002 | Konishi et al. |
| 2004/0135929 A1 | 7/2004 | Hoda et al. |
| 2006/0038926 A1 | 2/2006 | Mayer et al. |
| 2007/0174891 A1 | 7/2007 | Gouhara |

FOREIGN PATENT DOCUMENTS

| | | |
|---|---|---|
| CN | 1675925 A | 9/2005 |
| EP | 1 164 788 A2 | 12/2001 |
| JP | 10-145188 A | 5/1998 |
| JP | 2001-230689 A | 8/2001 |
| JP | 2001-313622 A | 11/2001 |
| JP | 2003-101507 | 4/2003 |
| JP | 2004-153481 | 5/2004 |
| JP | 2004-179928 A | 6/2004 |
| JP | 2004-266658 A | 9/2004 |
| JP | 2005-328136 A | 11/2005 |
| JP | 2005-348018 A | 12/2005 |
| JP | 2006-80757 A | 3/2006 |

* cited by examiner

SYMBOL PERIOD LENGTH ($t_s + t_g$)

| MODE | EFFECTIVE SYMBOL PERIOD LENGTH $t_s$ $\mu$sec |
|---|---|
| 1 | 252 |
| 2 | 504 |
| 3 | 1008 |

FIG. 13  Conventional Art

| GI RATIO g | GI PERIOD LENGTH $t_g$ μ sec | | |
|---|---|---|---|
| | MODE 1 | MODE 2 | MODE 3 |
| 1/4 | 63 | 126 | 252 |
| 1/8 | 31.5 | 63 | 126 |
| 1/16 | 15.75 | 31.5 | 63 |
| 1/32 | 7.875 | 15.75 | 31.5 |

FIG. 14  Conventional Art

| TYPE OF CARRIER | SIGNAL INTENSITY | THE NUMBER OF CARRIERS | | |
|---|---|---|---|---|
| | | MODE 1 | MODE 2 | MODE 3 |
| TOTAL NUMBER | – | 108 | 216 | 432 |
| DATA | 1 | 96 | 192 | 384 |
| SP | 4/3 | 9 | 18 | 36 |
| TMCC | 4/3 | 1 | 2 | 4 |
| AC1 | 4/3 | 2 | 4 | 8 |

DEMODULATION DEVICE, DEMODULATION DEVICE CONTROL METHOD, DEMODULATION DEVICE CONTROL PROGRAM, AND RECORDING MEDIUM WITH RECORDED DEMODULATION DEVICE CONTROL PROGRAM

TECHNICAL FIELD

The present invention relates to a demodulation device for receiving a digital broadcast wave (a broadcast wave of digital terrestrial broadcasting) for demodulation, and also to a method of controlling the demodulation device, a control program for controlling the demodulation device, and a storage medium storing the control program for controlling the demodulation device.

BACKGROUND ART

Digital terrestrial broadcasting has started recently thanks to progress in TV technology. A major modulation scheme for digital broadcasting, especially for better resilience to building-induced ghosting interference (also often termed "fading" or "multipaths"), is orthogonal frequency division multiplexing ("OFDM"), which utilizes a multi-carrier system.

OFDM modulation/demodulation is a digital modulation/demodulation scheme utilizing numerous (approximately 256 to 1024) sub-carriers in a single channel bandwidth for efficient transmission of video/audio signals. The OFDM modulation/demodulation performs Inverse Fast Fourier Transform ("IFFT") on all carriers to generate OFDM-modulated base band ("BB") signals. A period of an IFFT window is an effective symbol period $t_s$ which corresponds to an $F_s$ clock N period. The sum of all digitally modulated carriers with the effective symbol period $t_s$ as a base unit is termed an OFDM transmission symbol.

An actual transmission symbol is generally constituted by an effective symbol to which a period $t_g$ termed a guard interval (GI) is added, as illustrated in FIG. 11. A waveform for this GI period $t_g$ is a repetition of a signal waveform for an end segment 200 of the effective symbol period $t_s$. Therefore, a symbol period length of the transmission symbol is the sum of the effective symbol period $t_s$ and the GI period $t_g$. FIG. 11, relating to conventional art, illustrates the symbol period length of the transmission symbol.

ARIB STD-B31, a standard for digital terrestrial broadcasting entitled "Transmission System for Digital Terrestrial Television Broadcasting," defines the effective symbol period length by means of a basic parameter termed a mode (MODE) as listed in FIG. 12. The standard also defines the GI period (μs) by means of a parameter termed a GI period length (GI ratio) which is a ratio to the effective symbol period lengths as listed in FIG. 13. FIG. 12, relating to conventional art, shows a relationship between (i) a type of mode and (ii) an effective symbol period length corresponding to the mode. FIG. 13, relating to conventional art, shows a relationship between (i) a GI ratio and (ii) a GI period length for different modes.

A collection of a plurality of transmission symbols is termed a transmission frame. More specifically, the transmission frame is constituted by approximately 100 transmission symbols, symbols for frame synchronization, and symbols for service identification. For example, according to the basic parameter of the ARIB STD-B31 entitled "Transmission System for Digital Terrestrial Television Broadcasting", one frame is constituted by 204 symbols.

According to the basic parameter, the carriers illustrated in FIG. 14 are allocated to each segment in one transmission symbol which has been QPSK (Quadrature Phase Shift Keying)-modulated, 16QAM (Quadrature Amplitude Modulation)-modulated, or 64QAM-modulated. That is, the following types of carrier are prepared: a data signal; an SP (Scattered Pilot) signal; a TMCC (Transmission and Multiplexing Configuration Control) signal; and an AC1 (Auxiliary Channel) signal. Further, (i) a signal intensity and (ii) the numbers of carriers respectively set for the mode (MODE) 1 to the mode (MODE) 3 are assigned to each of the carriers, according to its type. As illustrated in FIG. 14, the total number of carriers set for the mode (MODE) 1 is 108; that for the mode (MODE) 2 is 216; and that for the mode (MODE) 3 is 432. FIG. 14, relating to conventional art, shows (i) a relationship between a type of carrier and a signal intensity corresponding to the type and (ii) a relationship between the type of carrier and the numbers of carriers for different modes.

The SP signal is a pilot signal which is periodically inserted once every 12 carriers in a carrier direction and once every 4 symbols in a symbol direction. The TMCC signal is a signal including a frame synchronization signal, a transmission parameter, and the like. The AC1 signal is a signal including additional information. Unlike the SP signal, the TMCC signal and the AC1 signal are non-periodically inserted to carriers.

Incidentally, as well as conventional analog broadcasting, digital terrestrial broadcasting is required to set in advance a reception frequency, for example, by performing a channel search in an initial state. In digital terrestrial broadcasting, a channel search is performed as follows: After a broadcast signal is received, frame synchronization is established. Then, transmission control information such as TMCC information is extracted. Upon the extraction, a channel search is started. Therefore, there has been such a problem that it takes time to perform a channel search.

In order to deal with this, Patent Literature 1 (Japanese Patent Application Publication, Tokukai, No. 2005-328136 (Publication Date: Nov. 24, 2005)) discloses a channel detecting device including (i) periodic signal detecting means for detecting a periodic signal from a broadcast wave, (ii) periodic distribution determining means for determining a distribution state of a group of the periodic signals, and (iii) determining means for determining, in a case where the group of the periodic signals is within a predetermined width, that there is a digital signal in a certain channel. The channel detecting device disclosed in Patent Literature 1 allows for omission of a step of "confirming a completion of frame synchronization", which step takes most time in a broadcast channel detecting process. Further, the channel detecting device disclosed in Patent Literature 1 predicts the presence of a channel by referring to the distribution state of the group of the periodic signals which are detected. Thereby, the channel detecting device disclosed in Patent Literature 1 allows for a high-speed channel search.

Patent Literature 2 (Japanese Patent Application Publication, Tokukai, No. 2005-348018 (Publication Date: Dec. 15, 2005)) discloses a digital broadcast receiving device which performs a channel search (i) during a determination process for determining, out of three modes having different OFDM transmission symbol lengths, which mode a received broadcast signal belongs to or (ii) during a determining process for determining a ratio of a guard interval to an effective symbol period.

The digital broadcast receiving device disclosed in Patent Literature 2 performs a channel detection with respect to a reception signal in a time region which is not subjected to fast Fourier transform ("FFT") yet (i.e., a region which is not converted into a signal in a frequency region yet). This reduces time taken for a channel search.

However, the conventional arrangements arise such a problem that it is impossible to efficiently and quickly perform a channel search with respect to digital terrestrial broadcasting.

Specifically, with the channel detecting device disclosed in Patent Literature 1, in a case where it is determined whether or not there is a digital signal in a certain channel, it is required to detect a periodic signal a plurality of times so as to determine a distribution state of the periodic signals thus detected. This arises such a problem that it takes time for determining whether or not there is a digital signal in a certain channel.

Further, the digital broadcast receiving device disclosed in Patent Literature 2 performs a channel detection process on received channels including channels which clearly do not contain a broadcast wave. This arises such a problem that it is impossible to perform a channel search efficiently.

SUMMARY OF INVENTION

The present invention was made in view of the foregoing problems, and an objective of the present invention is to provide (i) a demodulation device capable of efficiently searching for a channel containing a digital broadcast wave, (ii) a method of controlling the demodulation device, (iii) a control program for controlling the demodulation device, and (iv) a storage medium storing the control program for controlling the demodulation device.

In order to attain the objective, the demodulation device according to the present invention is a demodulation device for demodulating a digital broadcast wave, which is a broadcast wave of digital terrestrial broadcasting, the digital broadcast wave being received by a tuner section, said demodulation device, including: broadcast wave determining means for determining whether or not there is a broadcast wave in a certain channel, in accordance with an intensity of a signal outputted from the tuner section; and digital broadcast wave determining means for determining, in a case where the broadcast wave determining means determines that there is a broadcast wave in the certain channel, whether or not the broadcast wave is a digital broadcast wave, the determining being made in accordance with the signal outputted from the tuner section.

According to this arrangement, because the demodulation device includes the broadcast wave determining means, it is possible for the demodulation device to determine whether or not there is a broadcast wave in a certain channel. Further, because the demodulation device includes the digital broadcast wave determining means, it is possible for the demodulation device to determine whether or not a broadcast wave is a digital broadcast wave, only on channels which are determined, by the broadcast wave determining means, as containing a broadcast wave.

As described above, it is possible for the demodulation device according to the present invention (i) to exclude channels which are determined, by the broadcast wave determining means, as not containing a broadcast wave and (ii) to cause the digital broadcast wave determining means to perform, only on channels which are determined as containing a broadcast wave, determination of whether or not the channels contain a digital broadcast wave.

Incidentally, comparing between (i) the determining process in which the broadcast wave determining means determines whether or not there is a broadcast wave in a certain channel and (ii) the determining process in which the digital broadcast wave determining means determines whether or not there is a broadcast wave of digital broadcasting in a certain channel, the latter requires longer process time than the former. That is, the former performs the determining process in accordance with an output from the tuner section, whereas the latter is required to perform, on an output from the tuner section, a calculation and the like so as to perform the determining process. Therefore, the latter requires much time. In a case where the former determining process is performed alone, it is impossible to accurately determine whether or not there is a broadcast wave of digital broadcasting in a certain channel. This is because the former determines that there is a broadcast wave in a certain channel not only in a case where there is a broadcast wave of digital broadcasting in the certain channel, but also in a case where there is a broadcast wave of analog broadcasting in the certain channel.

Because the demodulation device according to the present invention includes the digital broadcast wave determining means, it is possible for the demodulation device to accurately determine whether or not there is a digital broadcast wave in a certain channel. Here, channels on which the digital broadcast wave determining means performs the determination of whether or not there is a digital broadcast wave are narrowed down to channels which are determined, by the broadcast wave determining means, as containing a broadcast wave. Note that time required for the digital broadcasting wave determining means to perform the determining process is at least approximately 10 times longer than time required for the broadcast wave determining means to perform the determining process, although the time varies depending on the arrangement of the device and radio wave environment. In view of this, with this arrangement, it is possible for the demodulation device according to the present invention to more efficiently, on a plurality of channels, the determination of whether or not there is a digital broadcast wave, compared with the arrangement where all channels are subjected to the determination of whether or not there is a digital broadcast wave.

Thus, it is possible for the demodulation device according to the present invention to efficiently search for a channel containing a digital broadcast wave.

Further, in order to attain the foregoing objective, the demodulation device according to the present invention is a demodulation device for demodulating a digital broadcast wave transmitted by an orthogonal frequency division multiplexing method utilizing a transmission symbol including an effective symbol and a guard interval containing a repetition of a part of the effective symbol, the digital broadcast wave being received by a tuner section, said demodulation device, including: digital broadcast wave determining means for determining whether or not there is a digital broadcast wave in a certain channel, based on whether or not a change is present in a moving average value of a correlation with respect to a signal outputted from the tuner section, the moving average value being calculated using a period length of the guard interval as a moving average window.

Accordingly, it is possible for the demodulation device according to the present invention to efficiently determine whether or not there is a digital broadcast wave in a certain channel, based on whether or not a signal outputted from the tuner section contains a guard interval period.

Furthermore, in order to attain the foregoing objective, a method according to the present invention for controlling the demodulation device is a method of controlling a demodulation device for demodulating a digital broadcast wave, which is a broadcast wave of digital terrestrial broadcasting, the digital broadcast wave being received by a tuner section, said method including the steps of: (a) determining whether or not there is a broadcast wave in a certain channel, in accordance with an intensity of a signal outputted from the tuner section; and (b) determining, in a case where the step (a) determines that there is a broadcast wave in the certain channel, whether or not the broadcast wave is a digital broadcast wave, the determining being made in accordance with the signal outputted from the tuner section.

According to this method, because this method includes the step (a) of determining whether or not there is a broadcast wave in a certain channel, it is possible for the method to determine whether or not there is a broadcast wave in a certain channel. Further, because this method includes the step (b) of determining whether or not there is a digital broadcast wave in a certain channel, it is possible for the method to determine, only in a channel which is determined by the step (a) as containing a broadcast wave, whether or not the broadcast wave detected in the channel is a digital broadcast wave.

As described above, it is possible for the method according to the present invention for controlling the demodulation device (i) to exclude channels which are determined, by the step (a), as not containing a broadcast wave and (ii) to cause the step (b) to perform, only on channels which are determined as containing a broadcast wave, determination of whether or not the channels contain a digital broadcast wave.

Accordingly, with the method according to the present invention for controlling the demodulation device, it is possible to efficiently search for a channel containing a digital broadcast wave.

Moreover, in order to attain the foregoing objective, the method according to the present invention for controlling the demodulation device is a method of controlling a demodulation device for demodulating a digital broadcast wave transmitted by an orthogonal frequency division multiplexing method utilizing a transmission symbol including an effective symbol and a guard interval containing a repetition of a part of the effective symbol, the digital broadcast wave being received by a tuner section, said method including the step of: (a) determining whether or not there is a digital broadcast wave in a certain channel, based on whether or not a change is present in a moving average value of a correlation with respect to a signal outputted from the tuner section, the moving average value being calculated using a period length of the guard interval as a moving average window.

Accordingly, with the method according to the present invention for controlling the demodulation device, it is possible to efficiently determine whether or not there is a digital broadcast wave in a certain channel, based on whether or not a signal outputted from the tuner section contains a guard interval period.

BRIEF DESCRIPTION OF DRAWINGS

FIG. 13, relating to conventional art, shows a relationship between (i) a GI ratio and (ii) a GI period length for different modes.

FIG. 14, relating to conventional art, shows (i) a relationship between a type of carrier and a signal intensity corresponding to the type and (ii) a relationship between the type of carrier and the numbers of carriers for different modes.

DESCRIPTION OF EMBODIMENTS

Figure 1:
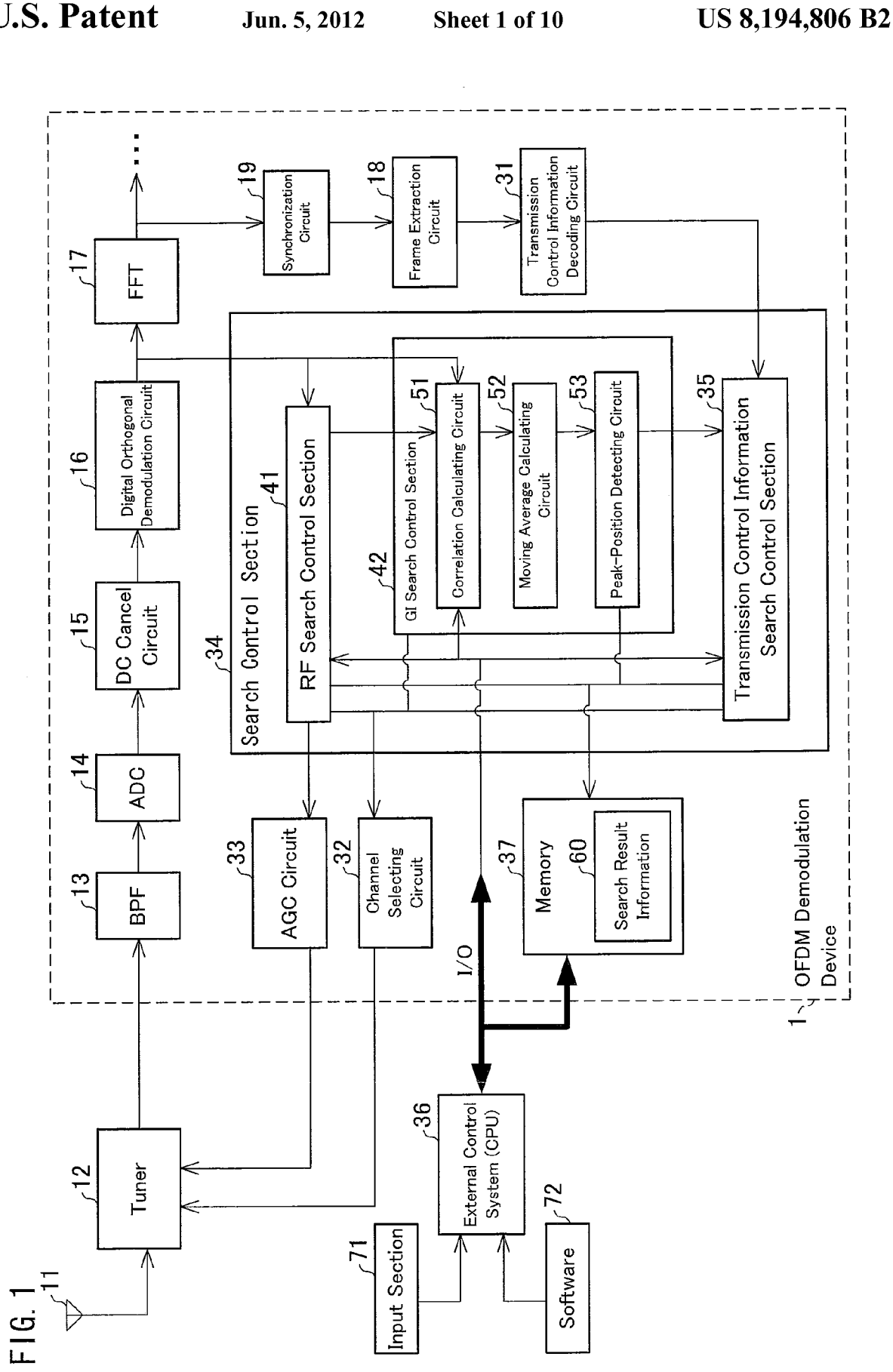
FIG. 1, relating to one embodiment of the present invention, is a block diagram illustrating an arrangement related to a search process and a demodulation determining process (a transmission control information search process).
Figure 2:
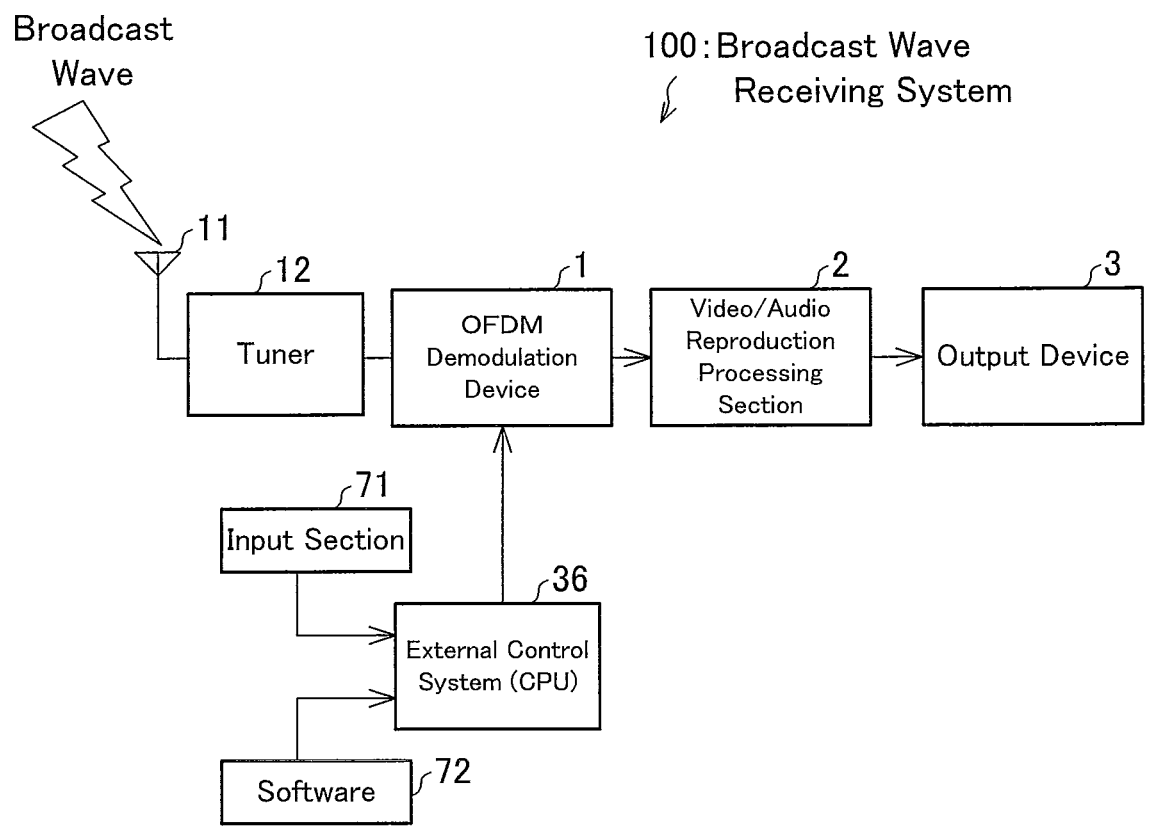
FIG. 2, relating to one embodiment of the present invention, is a block diagram illustrating an arrangement of main parts of a broadcast wave receiving system.

One embodiment of the present invention is described below with reference to FIG. 1 through FIG. 10. A broadcast wave receiving system 100 according to the present embodiment is for receiving a broadcast wave and demodulating the broadcast wave so as to output it as audio and video. As illustrated in FIG. 2, the broadcast wave receiving system 100 includes an OFDM demodulation device (a demodulation device) 1, a video/audio reproduction processing section 2, an output device 3, an antenna 11, a tuner (a tuner section) 12, an external control system 36, an input section 71, and software 72. FIG. 2, relating to one embodiment of the present invention, is a block diagram illustrating main parts of the broadcast wave receiving system 100.

The OFDM demodulation device 1 is for receiving a broadcast signal which has been OFDM-modulated, and demodulates the broadcast signal thus received. As illustrated in FIG. 2, the OFDM demodulation device 1 transmits, to the video/audio reproduction processing section 2, the broadcast signal thus demodulated, so that the broadcast signal is outputted to the output device 3 via the video/audio reproduction processing section 2. Also, the OFDM demodulation device 1 is for determining whether or not there is a broadcast wave of digital terrestrial broadcasting (i.e., a digital broadcast wave) in a selected channel.

The video/audio reproduction processing section 2 is for receiving a broadcast signal which has been demodulated by the OFDM demodulation device 1 and for converting the broadcast signal into a format allowing the broadcast signal to be subjected to an output process performed by the output device 3. After the conversion, the video/audio reproduction processing section 2 outputs the broadcast signal.

The output device 3 is for outputting video or audio, which has been received as a broadcast signal. The output device 3 may be realized by, for example, a display device such as an LCD and a CRT, an audio output device such as a speaker, or the like.

The antenna 11 is for receiving a broadcast wave transmitted from a broadcast station. Upon receipt of a broadcast wave, the antenna 11 outputs the broadcast wave as an RF signal to the tuner 12.

Figure 3:
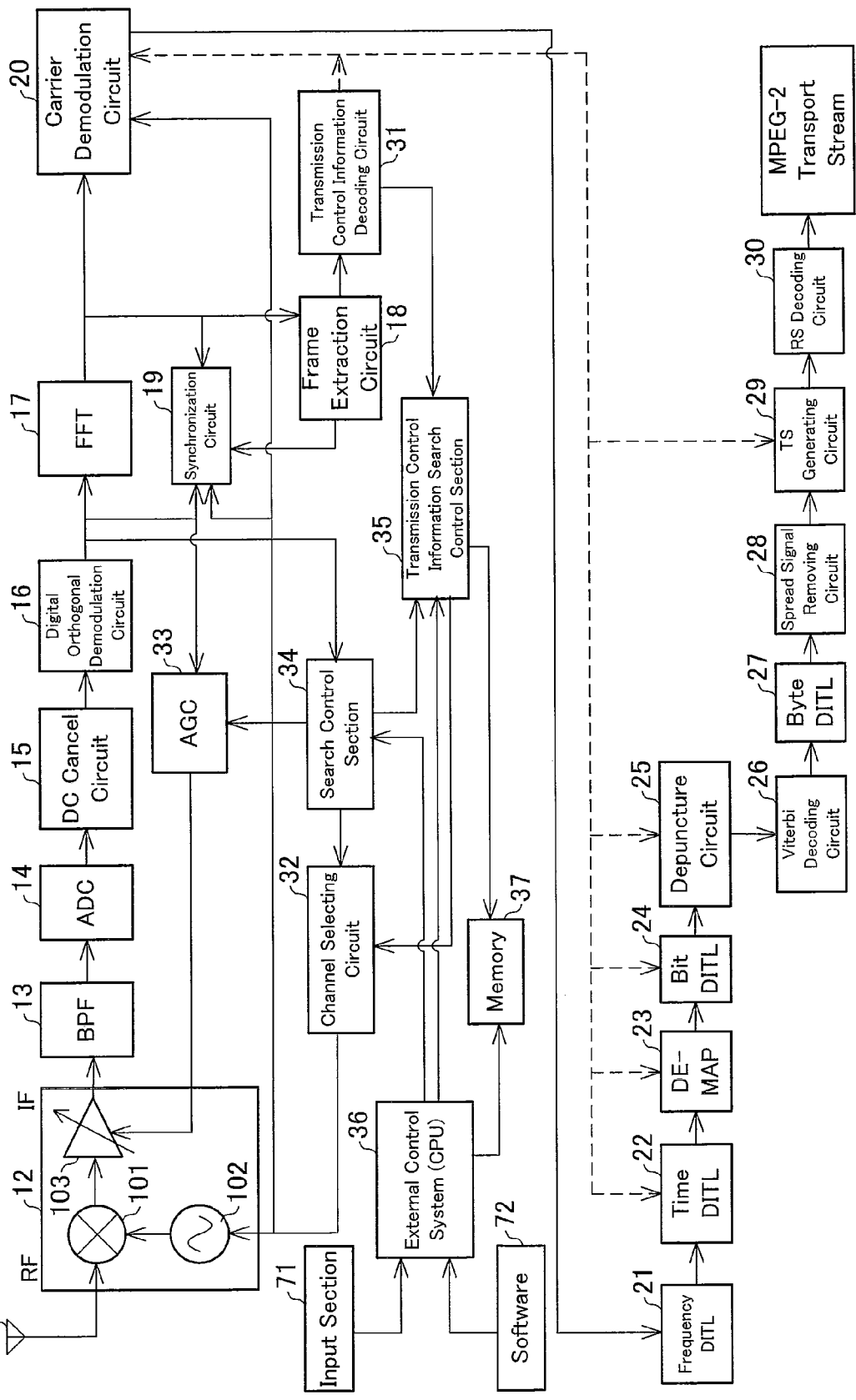
FIG. 3, relating to one embodiment of the present invention, is a block diagram illustrating an arrangement of main parts of an OFDM demodulation device.

The tuner 12 is for (i) receiving an RF signal transmitted from a broadcast station via the antenna 11 and for (ii) performing a frequency conversion on the RF signal so as to supply it as an IF signal to the OFDM demodulation device 1. As illustrated in FIG. 3, the tuner 12 includes a multiplier 101, a local oscillator 102, and an amplifier 103. It is possible to switch, in accordance with a channel selection signal supplied from a channel selecting circuit 32 (described later), an oscillation frequency of a reception carrier signal oscillated by the local oscillator 102.

The external control system 36 is for accepting instruction information inputted from the input section 71, which is provided outside the OFDM demodulation device 1. Also, the external control system 36 is for (i) reading out the software 72, which is stored in, for example, an external storage device or the like, and then (ii) executing a process in accordance with the software 72. The external control system 36 may be realized by, for example, a CPU or the like.

In a case where the external control system 36 accepts, from a user via the input section 71, instruction information requesting to determine whether or not there is a demodulatable digital broadcast wave (i.e., a digital broadcast wave which can be demodulated by the OFDM demodulation device 1) in each channel, the external control system 36 outputs the instruction information to the OFDM demodulation device 1. The input section 71 is for accepting an instruction from a user, and may be realized by, for example, a control button, a ten key, a keyboard, a mouse, or the like.

Further, the broadcast wave receiving system 100 according to the present embodiment is arranged so as to automatically determine, at a start-up of the system or at an initial start-up of the system, whether or not there is a demodulatable digital broadcast wave in a certain channel. Accordingly, at the start-up of the system or at the initial start-up of the system, the external control system 36 reads out the software 72, which is a program for controlling the whole system, and then the external control system 36 executes a process in accordance with the software 72. By executing the process, the external control system 36 outputs, to the OFDM demodulation device 1, instruction information requesting to determine whether or not there is a demodulatable digital broadcast wave in a certain channel.

The following describes, with reference to FIG. 3, an arrangement of the OFDM demodulation device 1 according to the present embodiment. FIG. 3, relating to one embodiment of the present invention, is a block diagram illustrating main parts of the OFDM demodulation device 1.

(Arrangement of OFDM Demodulation Device)

As illustrated in FIG. 3, the OFDM demodulation device 1 includes a band pass filter (BPF) 13, an A/D converting circuit (ADC) 14, a DC cancel circuit 15, a digital orthogonal demodulation circuit 16, an FFT operation circuit (FFT) 17, a frame extraction circuit 18, a synchronization circuit 19, a carrier demodulation circuit 20, a frequency deinterleaving circuit (frequency DITL) 21, a time deinterleaving circuit (time DITL) 22, a demapping circuit (DEMAP) 23, a bit deinterleaving circuit (BIT DITL) 24, a depuncture circuit 25, a Viterbi decoding circuit 26, a byte deinterleaving circuit (BYTE DITL) 27, a spread signal removing circuit 28, a transport stream generating circuit (TS generating circuit) 29, an RS decoding circuit 30, a transmission control information decoding circuit (an acquiring section) 31, a channel selecting circuit 32, an AGC circuit (AGC) (an AGC section) 33, a search control section (broadcast wave determining means, digital broadcast wave determining means) 34, a transmission control information search control section (demodulation determining means) 35, and a memory 37.

When a broadcast wave of digital terrestrial broadcasting is transmitted from a broadcast station, the broadcast wave is received by the antenna 11. Then, the broadcast wave thus received is outputted as an RF signal to the tuner 12. When the antenna 11 receives the broadcast wave in this manner, the tuner 12 performs a frequency conversion on the RF signal so as to generate an IF signal. Then, the IF signal thus generated is supplied to the BPF 13 in the OFDM demodulation device 1.

The IF signal outputted from the tuner 12 is filtered by the band pass filter (BPF) 13, and is digitalized by the A/D converting circuit (ADC) 14. The DC cancel circuit 15 removes a DC component from the IF signal thus digitalized. Then, the IF signal is supplied to the digital orthogonal demodulation circuit 16.

When the digital orthogonal demodulation circuit 16 receives, from the DC cancel circuit 15, the IF signal which has been digitalized, the digital orthogonal demodulation circuit 16 orthogonally demodulates the IF signal with use of a carrier signal having a predetermined frequency (carrier frequency) so as to output a base band OFDM signal. Here, the base band OFDM signal outputted from the digital orthogonal demodulation circuit 16 is a complex signal containing a real axis component (an I-channel signal) and an imaginary axis component (a Q-channel signal).

When the digital orthogonal demodulation circuit 16 orthogonally demodulates the IF signal and thereby generates the base band OFDM signal in this manner, the base band OFDM signal is supplied to the FFT operation circuit (FFT) 17, the synchronization circuit 19, and the AGC circuit 33.

When the base band OFDM signal is inputted from the digital orthogonal demodulation circuit 16, the FFT operation circuit 17 performs an FFT operation on the base band OFDM signal, in response to an operation start timing instruction transmitted from the synchronization circuit 19 (descried later).

That is, the FFT operation circuit 17 extracts, from one OFDM symbol, a portion of a signal which portion corresponds to an effective symbol period length. Then, the FFT operation circuit 17 performs the FFT operation on the portion of the signal thus extracted. More specifically, the FFT operation circuit 17 removes, from one OFDM symbol, a portion of a signal which portion corresponds to a guard interval (GI) length, and then performs the FFT operation on a remaining portion of the signal.

A range (i.e., an FFT window) of a portion to be extracted from a signal so that the FFT operation is performed thereon may be an arbitrary area in one OFDM transmission symbol, as far as signal points are continuous. In other words, a head position of a range of a portion to be extracted from a signal may be any position in a GI period.

A signal which is modulated onto sub-carriers by the FFT operation circuit 17 is a complex signal containing a real axis component (an I-channel signal) and an imaginary axis component (a Q-channel signal). The signal thus obtained is outputted from the FFT operation circuit 17 to the frame extraction circuit 18, the synchronization circuit 19, and the carrier demodulation circuit 20.

When the signal which has been modulated by the FFT operation circuit 17 is inputted, the frame extraction circuit 18 extracts a boundary of an OFDM transmission frame in accordance with the signals thus inputted.

The synchronization circuit 19 calculates a correlation with respect to the base band OFDM signal outputted from the digital orthogonal demodulation circuit 16, works out a boundary of an OFDM symbol, and sets an operation start timing at which the FFT operation circuit 17 starts an FFT operation (symbol synchronization). Further, the synchronization circuit 19 specifies a front end of each frame i.e., a head symbol out of symbols constituting a frame (frame synchronization).

Upon the establishment of the symbol synchronization and the frame synchronization, the transmission control information decoding circuit 31 extracts TMCC information from a TMCC signal, and outputs the TMCC information to the transmission control information search control section 35 (described later).

When the signal which is demodulated from the sub-carriers is supplied from the FFT operation circuit 17, the carrier demodulation circuit 20 performs a carrier modulation on the signal thus supplied. For example, in order to demodulate an OFDM signal defined by the standard of the ISDB-T (Integrated Services Digital Broadcasting for Terrestrial), the carrier demodulation circuit 20 performs a differential modulation such as DQPSK (Differential Quadrature Phase Shift Keying) or a synchronous modulation such as QPSK, 16QAM, and 64 QAM. Then, after the carrier demodulation circuit 20 performs the carrier demodulation on the signal, the carrier demodulation circuit 20 outputs the signal to the frequency deinterleaving circuit 21.

When the signal which has been subjected to the carrier demodulation is supplied, the frequency deinterleaving circuit 21 performs, on the signal, a deinterleaving process in a frequency direction. Then, the frequency deinterleaving circuit 21 outputs the signal to the time deinterleaving circuit 22. The time deinterleaving circuit 22 performs, on the signal inputted from the frequency deinterleaving circuit 21, a deinterleaving process in a time direction. Then, the time deinterleaving circuit 22 outputs the signal to the demapping circuit 23.

The demapping circuit 23 performs a reallocation of data (a demapping process) on the signal (the complex signal) which has been subjected to the carrier demodulation and has been inputted from the time deinterleaving circuit 22. Thereby, the demapping circuit 23 retrieves a transmission data sequence. For example, in order to demodulate an OFDM signal defined by the standard of the ISDB-T, the demapping circuit 23 performs the demapping process in accordance with the QPSK, the 16QAM, or the 64 QAM. Then, the demapping circuit 23 outputs, to the bit deinterleaving circuit 24, the transmission data sequence thus retrieved.

The bit deinterleaving circuit 24 performs, on the transmission data sequence outputted from the demapping circuit 23, a deinterleaving process, which is the reverse of bit-interleaving for scattering errors of a multilevel symbol. Then, the bit deinterleaving circuit 24 outputs, to the depuncture circuit 25, the transmission data sequence which has been subjected to the deinterleaving process.

The depuncture circuit 25 performs, on the transmission data sequence outputted from the bit deinterleaving circuit 24, a depuncturing process, which is the reverse of a puncturing process for reducing the number of transmission bits. Then, the depuncture circuit 25 outputs the transmission data sequence to the Viterbi decoding circuit 26.

The Viterbi decoding circuit 26 performs, on the transmission data sequence which has been subjected to the depuncturing process by the depuncture circuit 25, a Viterbi decoding process for decoding a bit string which has been convolutionally encoded. Then, the Viterbi decoding circuit 26 outputs the transmission data sequence to the byte deinterleaving circuit 27.

The byte deinterleaving circuit 27 performs, on the transmission data sequence which has been subjected to the Viterbi decoding process by the Viterbi decoding circuit 26, a deinterleaving process per byte. Then, the byte deinterleaving circuit 27 outputs the transmission data sequence to the spread signal removing circuit 28.

The spread signal removing circuit 28 performs, on the transmission data sequence which has been subjected to the deinterleaving process per byte by the byte deinterleaving circuit 27, an inverse energy dispersal process, which is the reverse of an energy dispersal process. Then, the spread signal removing circuit 28 inputs the transmission data sequence to the transport stream (TS) generating circuit 29.

When the TS generating circuit 29 receives the transmission data sequence from the spread signal removing circuit 28, the TS generating circuit 29 inserts, into a predetermined position in the stream, data (e.g., a null packet) defined by each broadcasting system. Further, the TS generating circuit 29 performs a so-called smoothing process on the transmission data sequence. The smoothing process is a process for smoothing bit intervals between intermittently supplied streams so as to obtain a temporally-continuous stream. The transmission data sequence which has been subjected to the smoothing process is supplied to the RS decoding circuit 30.

The RS decoding circuit 30 performs a Reed-Solomon decoding process on the transmission data sequence inputted from the TS generating circuit 29. Then, the RS decoding circuit 30 outputs, to the video/audio reproduction processing section 2, the transmission data sequence as a TS defined by an MPEG-2 system.

The transmission control information decoding circuit 31 decodes, in accordance with the transmission control information outputted from the frame extraction circuit 18, transmission control information (e.g., TMCC) modulated to a predetermined position in the OFDM transmission frame. Then, the transmission control information thus decoded is supplied by the transmission control information decoding circuit 31 to the following circuits: the carrier demodulation circuit 20, the time deinterleaving circuit 22, the demapping circuit 23, the bit deinterleaving circuit 24, the depuncture circuit 25, and the TS generating circuit 29. The transmission control information supplied from the transmission control information decoding circuit 31 is used by each circuit to perform controls such as a demodulation and a reproduction.

As described above, when the symbol synchronization and the frame synchronization are established by the synchronization circuit 19, the transmission control information decoding circuit 31 extracts the TMCC information from the TMCC signal. Then, the TMCC information thus extracted is outputted to the transmission control information search control section 35 for executing a transmission control information search process.

The AGC circuit 33 controls, in accordance with an output from the digital orthogonal demodulation circuit 16, the amplifier 103 included in the tuner 12 so that the tuner 12 has an output having a constant average electric power. In response to a control instruction transmitted from an RF search control section 41 included in the search control section 34, the AGC circuit 33 stops automatic gain control ("AGC") with respect to the amplifier 103, and sets a gain value of the amplifier 103 so that the gain value is greater than a gain value obtained in an ordinary-used state in which the AGC is performed (described later).

The search control section 34 is a control circuit for determining whether or not there is a broadcast wave of digital terrestrial broadcasting in a certain channel. As illustrated in FIG. 1, the search control section 34 includes the RF search control section (broadcast wave determining means, gain setting means) 41 and a GI search control section (digital broadcast wave determining means) 42. The search control section 34 will be described in detail later.

In a case where the search control section 34 determines, as a result of the search process, that there is a broadcast wave of digital broadcasting in a selected channel, the transmission control information search control section 35 determines whether or not a broadcast signal of the broadcast wave is demodulatable by the OFDM demodulation device 1. If the transmission control information search control section 35 determines that the broadcast signal of the broadcast wave is demodulatable by the OFDM demodulation device 1, the transmission control information search control section 35 stores the selected channel as search result information 60 in the memory 37.

Especially, it is possible for the OFDM demodulation device 1 according to the present embodiment to quickly perform a search for a channel from which a broadcast wave of digital terrestrial broadcasting is receivable. Therefore, the OFDM demodulation device 1 does not give inconvenience to a user even in a case where the search is set to be performed at a start-up. Further, by having the arrangement where a search for a channel is performed automatically, it is possible to omit a user's operation for requesting a search process.

Determining whether or not there is a demodulatable digital broadcast wave in a certain channel is performed either (i) in response to an instruction given by a user or (ii) automatically, in accordance with a setting which is switchable as needed.

The memory 37 stores the search result information 60. The search result information 60 indicates a channel from which a demodulatable broadcast wave of digital broadcasting is receivable. The memory 37 may be realized by, for example, a storage element such as a register or a semiconductor storage device such as an RAM.

By reading out the software 72 for controlling the whole system or by receiving an instruction inputted from the input section 71, it is possible for the external control system 36 to access information stored in the memory 37. Therefore, by operating the external control system 36, it is possible for the broadcast wave receiving system 100 according to the present embodiment to recognize a channel containing a digital broadcast wave.

Each of the synchronization circuit 19, the FFT operation circuit 17, and the frame extraction circuit 18 includes a memory (not illustrated) for storing a base band ("BB") signal, for the purpose of performing the symbol synchronization, detection of an error in a carrier frequency, and the frame synchronization.

Further, it is preferable that the OFDM demodulation device 1 is arranged so as to further include a waveform equivalent processing circuit (not illustrated in FIG. 1). The waveform equivalent processing circuit removes, on the basis of a pilot carrier in a transmission symbol, an effect of channel environment (e.g., noises, multipaths, and Rayleigh fading) from a signal outputted from the FFT operation circuit 17. This is for improving resistance to the channel environment. In the case where the OFDM demodulation device 1 further includes the waveform equivalent processing circuit, the waveform equivalent processing circuit also includes a memory (not illustrated) for storing pilot signals (e.g., an SP carrier) and data carriers of a plurality of symbols.

The time deinterleaving circuit 22 performs different delay processes for different carrier numbers, respectively. Thereby, the time deinterleaving circuit 22 retrieves digital data which has been subjected to time interleaving. In a case where the standard of the digital terrestrial broadcasting is "MODE 3" and an interleave length is 4, the time deinterleaving circuit 22 is required to perform the delay process by 0 to, at maximum, approximately 400 symbols (this varies depending on the carrier number). Therefore, the time deinterleaving circuit 22 includes memories (not illustrated) which store data of, for example, 400 symbols at maximum, respectively, and whose number corresponding to the necessary number of carriers.

The Viterbi decoding circuit 26 includes a memory (not illustrated) for storing a trellis path for decoding a convolutional code. According to the standard for digital terrestrial broadcasting, for example, in a case of a convolutional code whose constraint length is K=7, it is necessary to store connection information of $2^{K-1}$=64 which connection information corresponding to a traceback length. If the traceback length is increased for the purpose of improving error correction ability, the memory included in the Viterbi decoding circuit 26 requires a larger memory area.

The RS decoding circuit 30 detects an error area and corrects the error, for example, by means of a Berlekamp-Massey algorithm. In this process, because it is necessary to perform a calculation using a Galois field, processing time for the calculation is required. In view of this, the RS decoding circuit 30 includes a memory (not illustrated) for storing, during this process, (i) a TS packet to be processed and (ii) a TS packet which is inputted following the TS packet to be processed. This is for the purpose of performing a real-time process for RS decoding.

Next, the following describes, with reference to FIG. 1 and FIG. 4 through FIG. 9, a search process, performed by the OFDM demodulation device 1, for determining whether or not there is a broadcast wave of digital terrestrial broadcasting in a selected channel, the broadcast wave corresponding to the selected channel.

(Search Process)

As illustrated in FIG. 1, the OFDM demodulation device 1 according to the present embodiment includes, as an arrangement related to the search process, the search control section 34 containing the RF search control section 41 and the GI search control section 42. FIG. 1, relating to one embodiment of the present invention, is a block diagram illustrating an arrangement related to the search process and a demodulation determining process (the transmission control information search process). Further, the OFDM demodulation device 1 is arranged so as to determine whether or not there is a broadcast wave of digital broadcasting in a selected channel, in accordance with an output from the tuner 12. Furthermore, the OFDM demodulation device 1 is arranged so as to determine whether or not there is a digital broadcast wave in a selected channel, in accordance with a moving average value of a correlation with respect to a reception signal received by the tuner 12.

The RF search control section 41 integrates, in response to a control signal for instructing the execution of the search process, an intensity of a signal outputted from the tuner 12 for a predetermined period. Then, in accordance with an integral value thus obtained, the RF search control section 41 determines whether or not there is a broadcast wave in a selected channel. If the RF search control section 41 determines that there is a broadcast wave in the selected channel, the RF search control section 41 outputs a control signal for instructing the GI search control section 42 to determine whether or not the broadcast wave is a broadcast wave of digital terrestrial broadcasting. On the other hand, if the RF search control section 41 determines that there is no broadcast wave in the selected channel, the RF search control section 41 instructs the channel selecting circuit to select a next channel.

In the case where the RF search control section 41 determines that there is a broadcast wave in the selected channel, the GI search control section 42 determines whether or not the signal outputted from the tuner 12 contain a GI period, and thereby determines whether or not there is a digital broadcast wave in the selected channel. If the GI search control section 42 determines that there is a digital broadcast wave in the selected channel, the GI search control section 42 instructs the transmission control information search control section 35 to determine whether or not the digital broadcast wave received is demodulatable. On the other hand, if the GI search control section 42 determines that there is no digital broadcast wave in the selected channel, the GI search control section 42 instructs the channel selecting circuit to select a next channel.

Here, the following describes, in detail, a process (i.e., an RF search) in which the RF search control section 41 determines whether or not there is a digital broadcast wave in a selected channel.

(RF Search Process)

Firstly, when the input section 71 accepts, from a user, a control signal for instructing the execution of the search process, the input section 71 outputs the control signal to the RF search control section 41 via the external control system 36. When the control signal is supplied from the external control system 36, the RF search control section 41 controls the tuner 12 to perform, instead of the AGC, a gain control for setting a gain to a fixed value (a fixed gain value). Here, the fixed gain value is set so as to be greater than a gain value obtained while the tuner 12 is used in an ordinary manner.

In other words, in response to the control signal from the external control system 36, the RF search control section 41 causes the AGC circuit 33 to stop the AGC, and causes the AGC circuit 33 to set an gain value of the amplifier 103 (included in the tuner 12) to a fixed value which is greater than a gain value obtained in an ordinarily-used state. The gain value set here is, for example, a maximum amplifiable value of the amplifier 103.

An output signal (an IF signal) from the tuner 12 which output signal has been amplified in accordance with the gain value thus set is filtered by the BPF 13, and then is digitalized by the A/D converting circuit 14. Then, the DC cancel circuit 15 removes a DC component from the IF signal thus digitalized, and then supplies the IF signal to the digital orthogonal demodulation circuit 16. When the digital orthogonal demodulation circuit 16 receives the IF signal thus digitalized, the digital orthogonal demodulation circuit 16 orthogonally demodulates the signal, and outputs an OFDM signal which is digitalized.

The RF search control section 41 receives the OFDM signal outputted from the digital orthogonal demodulation circuit 16, and integrates value of the OFDM signal for a predetermined period. II an integral value thus obtained reaches a threshold value or more, the RF search control section 41 determines that there is a broadcast wave in a selected channel.

Figure 4:
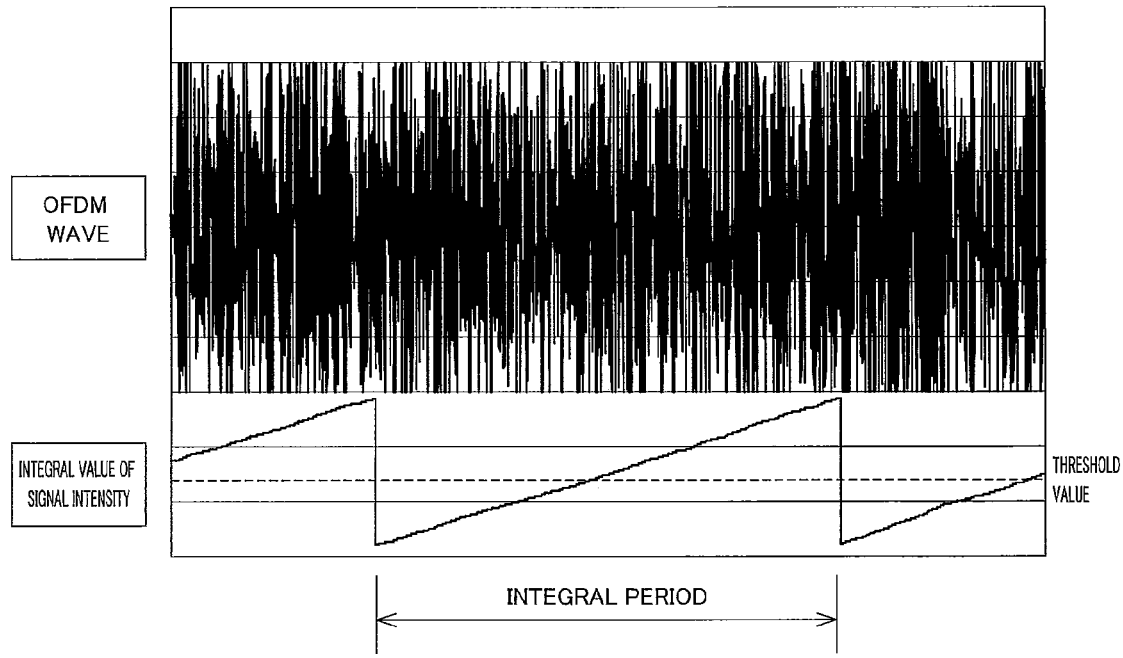
FIG. 4 shows a relationship between (i) a change in an integral value obtained by integrating, for a predetermined integral period, a reception signal which has been amplified and (ii) a broadcast wave (an OFDM wave) received.

More specifically, a reception signal is amplified as illustrated in FIG. 4. Then, at a point that an integral value obtained by integrating the reception signal for a predetermined period reaches a threshold value or more, the RF search control section 41 determines that there is a broadcast wave in a selected channel. FIG. 4 shows a relationship between (i) a change in an integral value obtained by integrating, for a predetermined integral period, a reception signal which has been amplified and (ii) a broadcast wave (an OFDM wave) received.

Subsequently, the RF search control section 41 outputs a control signal for instructing the GI search control section 42 to determine whether or not an output signal from the tuner 12 is a broadcast wave of digital terrestrial broadcasting. On the other hand, if the RF search control section 41 determines that there is no broadcast wave in the selected channel, the RF search control section 41 outputs a control signal for instructing the channel selecting circuit 32 to select a next channel.

The threshold value is set on the basis of an intensity of a signal which intensity is measured in a case where a broadcast wave is received in a weak electric field area whose electric field intensity is approximately −100 dBm/13 seg. to approximately −110 dBm/13 seg. If an integral value equal to or more than a threshold value is not obtained, it is determined that there is no broadcast wave in a selected channel.

In this context, the RF search control section 41 is arranged so as to perform the "RF search process" in the following manner: An output signal from the tuner 12 is not subjected to the AGC, but is subjected to a gain control for setting a gain to a fixed value. Then, in accordance with an OFDM signal based on the output signal which has been amplified according to the fixed value, it is determined whether or not there is a broadcast wave in a selected channel.

However, the present invention is not limited to this. For example, the RF search control section 41 may be arranged so as to perform the "RF search process" in the following manner: For example, instead of an OFDM signal outputted from the digital orthogonal demodulation circuit 16, an intensity of an output signal from the tuner 12 is directly integrated. Then, in accordance with an integral value thus obtained, it is determined whether or not there is a broadcast wave in a selected channel.

Figure 5:
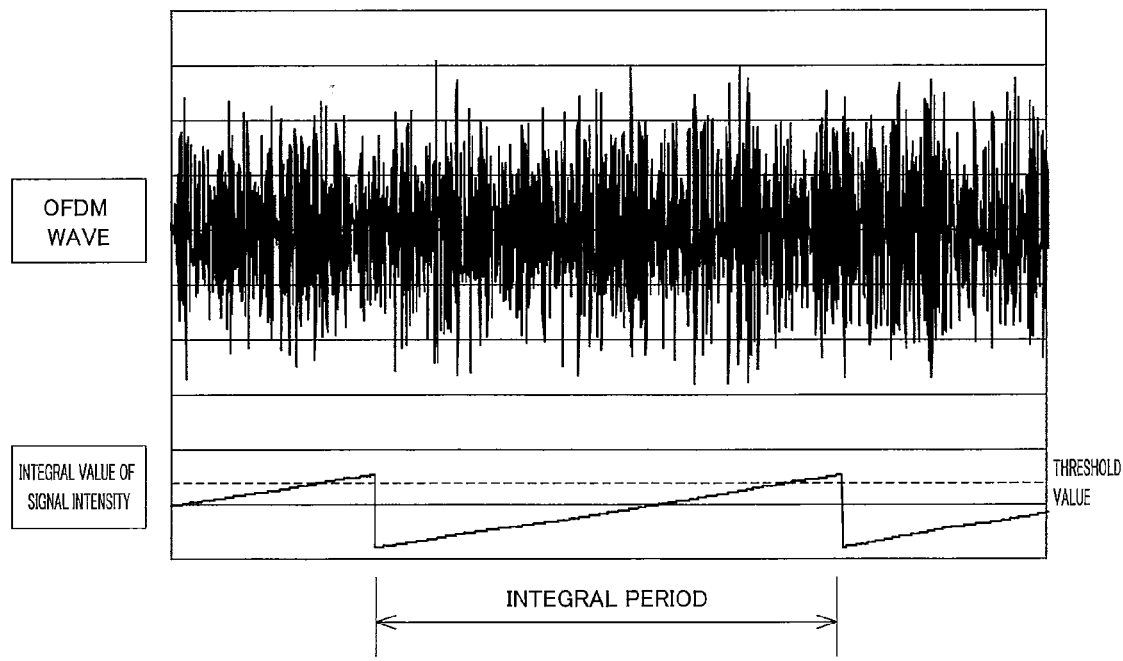
FIG. 5 shows a relationship between (i) a change in an integral value obtained by integrating a reception signal for a predetermined integral period and (ii) a broadcast wave (an OFDM wave) received.

Further, the RF search control section 41 may be arranged so as to perform the "RF search process" in the following manner: An OFDM signal is digitalized based on (i) an output signal from the tuner 12 which output signal is subjected to the AGC or (ii) an output signal from the tuner 12, without amplifying an output signal from the tuner 12 in accordance with a fixed value. Then, the OFDM signal thus obtained is integrated, so that an integral value is obtained. In accordance with the integral value, it is determined whether or not there is a broadcast wave in a selected channel. More specifically, as illustrated in FIG. 5, it is determined whether or not an integral value obtained by integrating an intensity of an OFDM signal for a predetermined integral period exceeds a threshold value. Thereby, it is determined whether or not there is a broadcast wave in a selected channel. FIG. 5 shows a relationship between (i) a change in an integral value obtained by integrating a reception signal for a predetermined integral period and (ii) a broadcast wave (an OFDM wave) received.

Figure 6:
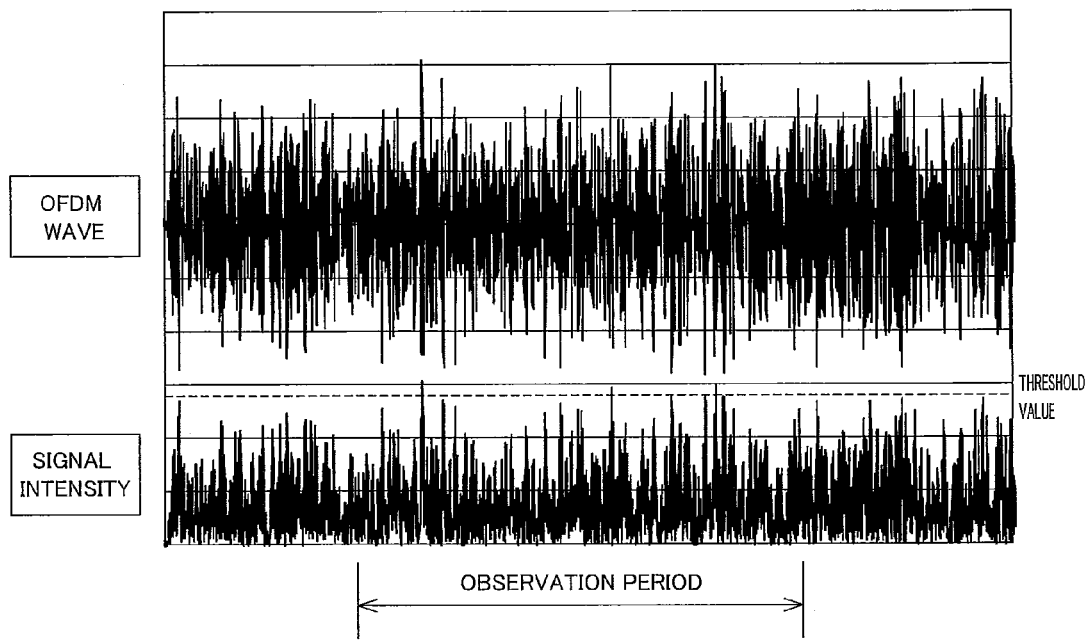
FIG. 6 shows a relationship between (i) an intensity of a reception signal and (ii) a broadcast wave (an OFDM wave) received, the relationship being observed for a predetermined observation period.

Furthermore, instead of using an integral value as described above, the RF search control section 41 may be arranged so as to perform the "RF search process" in the following manner: It is determined whether or not (i) an intensity of an output signal from the tuner 12 or (ii) an intensity of an OFDM signal which is digitalized based on an output signal from the tuner 12 reaches a threshold value or more in a predetermined observation period. Based on the result, it is determined whether or not there is a broadcast wave in a selected channel. More specifically, as illustrated in FIG. 6, it is determined whether or not there is a broadcast wave in a selected channel, in accordance with whether or not an intensity of an OFDM signal exceeds a threshold value in a predetermined observation period. FIG. 6 shows a relationship between (i) an intensity of a reception signal and (ii) a broadcast wave (an OFDM wave) received, the relationship being observed for a predetermined observation period.

However, compared with these arrangements, the following arrangement is more preferable: An output signal from the tuner 12 is amplified in accordance with a fixed value. Then, the output signal thus amplified (or an OFDM signal obtained based on the output signal thus amplified) is integrated, so that an integral value is obtained. In accordance with the integral value thus obtained, it is determined whether or not there is a broadcast wave in a selected channel. This arrangement is preferable because this makes it possible to more quickly determine whether or not there is a broadcast wave in a selected channel. In other words, by amplifying the output signal from the tuner 12 to the fixed value, i.e., by setting the output value to be greater than an output value obtained as a result of the AGC, it is possible to advance a timing at which an integral value reaches the threshold value or more. This makes it possible to more quickly determine whether or not there is a broadcast wave in a selected channel.

Further, with the arrangement where an intensity of an output signal is amplified in accordance with a fixed value, it is possible to set a threshold value easily even in a case where a broadcast wave is received in a weak electric field area whose electric field intensity is approximately −100 dBm/13 seg. to approximately −110 dBm/13 seg. This is because this arrangement increases a range in which a threshold value is settable. This makes it possible to set a threshold value which is more reliable.

For example, assume that a maximum intensity of a signal of a broadcast wave is 10, and a maximum intensity of a noise is 8. Further suppose that the intensities are amplified by 10 times, respectively. Then, the maximum intensity of the signal of the broadcast wave is 100, and the maximum intensity of the noise is 80.

That is, the range in which a threshold value is settable is 9 to 10 before the intensities are amplified by 10 times; on the other hand, the range in which a threshold value is settable is 81 to 100 after the amplification. This means that the range in which a threshold value is settable is increased by 10 times, from 2 to 20. Thus, this arrangement is preferable in the following point: The range in which a threshold value is settable is increased, and thereby it is possible to accurately determine whether or not there is a broadcast wave in a selected channel. This effect is also attained in the case where an intensity of a signal is integrated.

As described above, stopping the AGC and amplifying an output from the tuner 12 to a fixed value is very effective in (i) reducing processing time taken for the "search process" and (ii) accurately determining, even in a weak electric field area, whether or not there is a broadcast wave in a selected channel.

Figure 7:
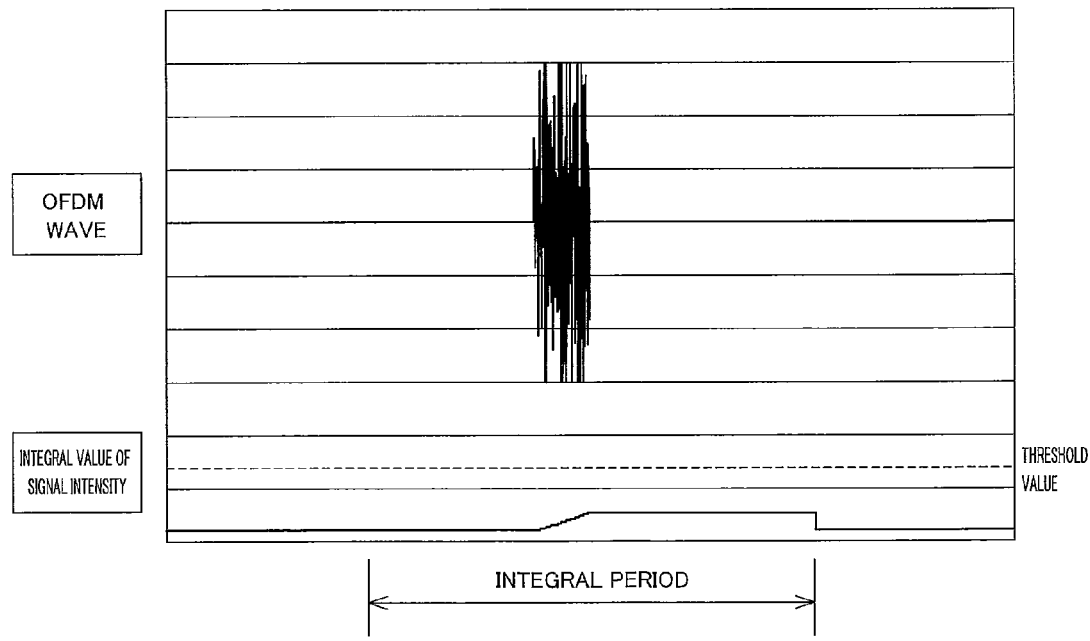
FIG. 7, illustrating a case where a noise is received, shows a relationship between (i) a change in an integral value obtained by integrating a reception signal for a predetermined integral period and (ii) the noise.

Further, compared with determining, in accordance with an intensity of an output signal, whether or not there is a broadcast wave in a selected channel, determining, in accordance with an integral value obtained by integrating an output signal, whether or not there is a broadcast wave in a selected channel is more effective in the following points:

For example, in the case where it is determined, in accordance with an intensity of an output signal from the tuner 12, whether or not there is a broadcast wave in a selected channel, the following case may happen: If a pulse-like noise as illustrated in FIG. 7 instantly occurs, it can be wrongly determined that there is a broadcast wave in a selected channel, regardless of the fact that a broadcast wave is not actually present. On the other hand, in the case where it is determined, in accordance with an integral value obtained by integrating an intensity of an output signal, whether or not there is a broadcast wave in a selected channel, it is possible to prevent such the wrong determination (i.e., such the case where it is determined that there is a broadcast wave in a selected channel, regardless of the fact that a broadcast wave is not actually present). This is because, as long as a noise occurred is adequately shorter than an integral period, an integral value does not exceed a threshold value.

FIG. 7, illustrating a case where a noise is received, shows a relationship between (i) a change in an integral value obtained by integrating a reception signal for a predetermined integral period and (ii) the noise.

Thus, as seen in the OFDM demodulation device 1 according to the present embodiment, performing the "RF search process" in accordance with an integral value obtained by amplifying an output signal from the tuner 12 and integrating the output signal thus amplified has the following strong points: (I) Such the OFDM demodulation device 1 reduces time taken for the search process. (II) Such the OFDM demodulation device 1 accurately determines, even in a weak electric field area, whether or not there is a broadcast wave in a selected channel. (III) Such the OFDM demodulation device 1 prevents a wrong determination of whether or not a broadcast wave is present in a selected channel, the wrong determination being made due to a noise.

The OFDM demodulation device 1 is arranged as follows: In a process for selecting a new channel so as to determine whether or not there is a broadcast wave therein, the RF search control section 41 does not perform the determination of whether or not there is a broadcast wave, during a period from (i) the moment an instruction for selecting a new channel is outputted to (ii) the moment the tuner 12 outputs a signal received in a desired channel. With this, the following situation is avoided: It is determined whether or not there is a broadcast wave in the new channel, in accordance with an intensity of a reception signal including a reception signal received in a channel which has been subjected to the search previously.

Figure 8:
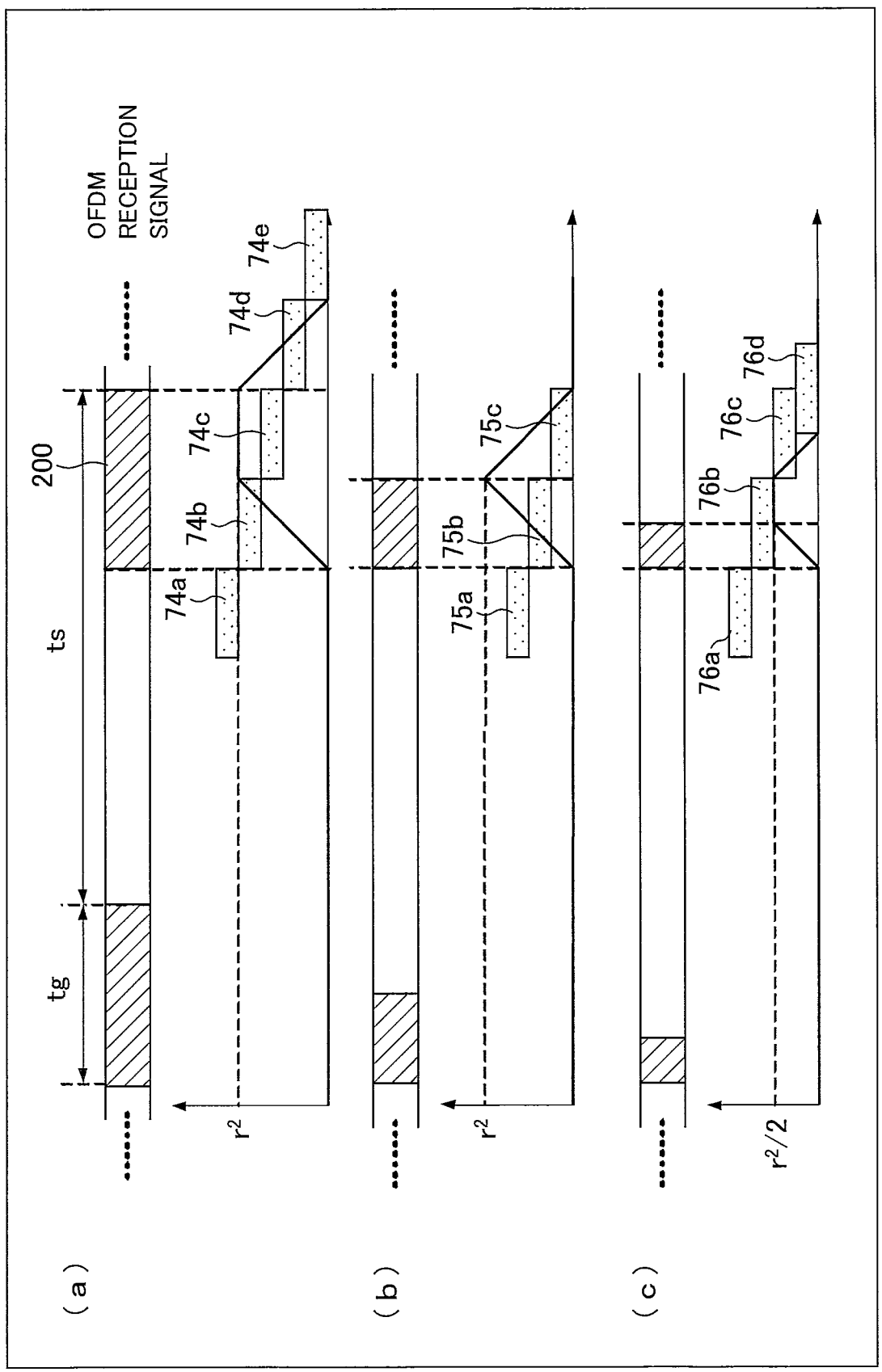
FIG. 8 shows a relationship between (i) a symbol period length of a transmission symbol, (ii) a moving average window, and (iii) a moving average value of a correlation with respect to the transmission symbol, the moving average value being calculated using the moving average window. (a) of FIG. 8 illustrates a case where the moving average window is smaller than a GI period; (b) of FIG. 8 illustrates a case where the moving average window is equal to the GI period; and (c) of FIG. 8 illustrates a case where the moving average window is larger than the GI period.

Next, the following describes, with reference to FIG. 1, FIG. 8, and FIG. 9 again, the GI search process in detail. The GI search process is performed as follows: If the foregoing "RF search process" gives a result indicating that there is a broadcast wave in a selected channel, the GI search control section 42 determines whether or not a signal outputted from the tuner 12 contains a GI period, and thereby determines whether or not there is a digital broadcast wave in the selected channel.

(GI Search Process)

Incidentally, as described above, an OFDM transmission symbol is constituted by an effective symbol to which a period called a GI (GI period $t_g$) is added. A waveform for the GI period $t_g$ is a repetition of a signal waveform for an end segment 200 of an effective symbol period $t_s$. Therefore, a part (i.e., the end period segment 200 of the effective symbol period $t_s$) which is apart from the GI period $t_g$ by the effective symbol period $t_s$ correlates with the GI period $t_g$.

In view of this, by calculating, using a GI period as a moving average window, a moving average value of a correlation with respect to an output signal from the tuner 12, it is possible for the GI search control section 42 to determine whether or not a signal outputted from the tuner 12 correlates with a broadcast wave. Further, based on the determination result, it is possible for the GI search control section 42 to recognize whether or not there is a broadcast wave in a selected channel.

In other words, as illustrated in (a) and (b) of FIG. 8, when a moving average window enters a range in which the moving average window overlaps the end segment 200 of the effective symbol period $t_s$, a moving average value which is significant as a moving average value is obtained. As the moving average window is shifted from 74a toward 74b (or from 75a toward 75b), the moving average value is increased. When the moving average value reaches a threshold value ($r^2$) or more, the GI search control section 42 determines that the signal correlates with the broadcast wave.

As described above, a GI period length (a GI ratio), which is a ratio to each effective symbol period length $t_s$, is defined for each mode (MODE). In view of this, the OFDM demodulation device 1 according to the present embodiment sets, as a moving average window, a GI period $t_g$ which is assumed to be minimum in every mode. This is for the purpose of detecting all GI period lengths of different modes by performing a process once.

For example, in a case where a moving average window segment is set to be larger than an end segment 200 of an effective symbol period $t_s$, a moving average value obtained while the moving average window is shifted from 76a toward 76b does not reach a threshold value, as illustrated in (c) of FIG. 8. This prevents the determining from being made properly. On the other hand, in a case where a moving average window is set to be a GI period $t_g$ which is assumed to be minimum in every mode, a moving average value calculated always reaches a threshold value or more, regardless of a value of a GI period length of an OFDM wave which is received.

Further, assuming that $r^2$ is a maximum value which can be obtained in a case where all points in a moving average window correlate with one another, a threshold value is set as needed in a range of $r^2/2$ or more but $r^2$ or less. The "$r^2$" is, specifically, equal to a value obtained by squaring an average electric power which is inputted to a correlation calculating circuit 51 (i.e., an average intensity of an OFDM signal).

FIG. 8 shows a relationship between (i) a symbol period length of a transmission symbol, (ii) a moving average window, and (iii) a moving average value of a correlation with respect to the transmission symbol, the moving average value being calculated using the moving average window. (a) of FIG. 8 illustrates a case where the moving average window is smaller than the GI period; (b) of FIG. 8 illustrates a case where the moving average window is equal to the GI period; and (c) of FIG. 8 illustrates a case where the moving average window is larger than the GI period.

Here, the following describes, with reference to FIG. 1, an arrangement of the GI search control section 42, which is related to the GI search process.

As illustrated in FIG. 1, the GI search control section 42 includes the correlation calculating circuit 51, a moving average calculating circuit 52, and a peak-position detecting circuit 53.

In response to an instruction given by the RF search control section 41, the correlation calculating circuit 51 delays, by an effective symbol period length $t_s$, a base band OFDM signal outputted from the digital orthogonal demodulation circuit 16. Then, the correlation calculating circuit 51 calculates a correlation between (i) the base band OFDM signal before the delay and (ii) the base band OFDM signal after the delay. Then, the correlation calculating circuit 51 outputs, to the moving average calculating circuit 52, a value thus calculated.

The moving average calculating circuit 52 calculates a moving average value in accordance with the value outputted from the correlation calculating circuit 51. Then, the moving average calculating circuit 52 outputs a calculation result to the peak-position detecting circuit 53.

The peak-position detecting circuit 53 determines whether or not the peak of the moving average value reaches a predetermined threshold value or more, in accordance with the calculation result outputted from the moving average calculating circuit 52. If the peak of the moving average value reaches the predetermined threshold value or more, the peak-position detecting circuit 53 determines that there is a digital broadcast wave in a selected channel, and instructs the transmission control information search control section 35 to determine whether or not the broadcast wave is demodulatable by the OFDM demodulation device 1.

On the other hand, if the peak of the moving average value does not reach the predetermined threshold value, the peak-position detecting circuit 53 determines that there is no broadcast wave in the selected channel, and instructs the channel selecting circuit 32 to select a next channel.

Figure 9:
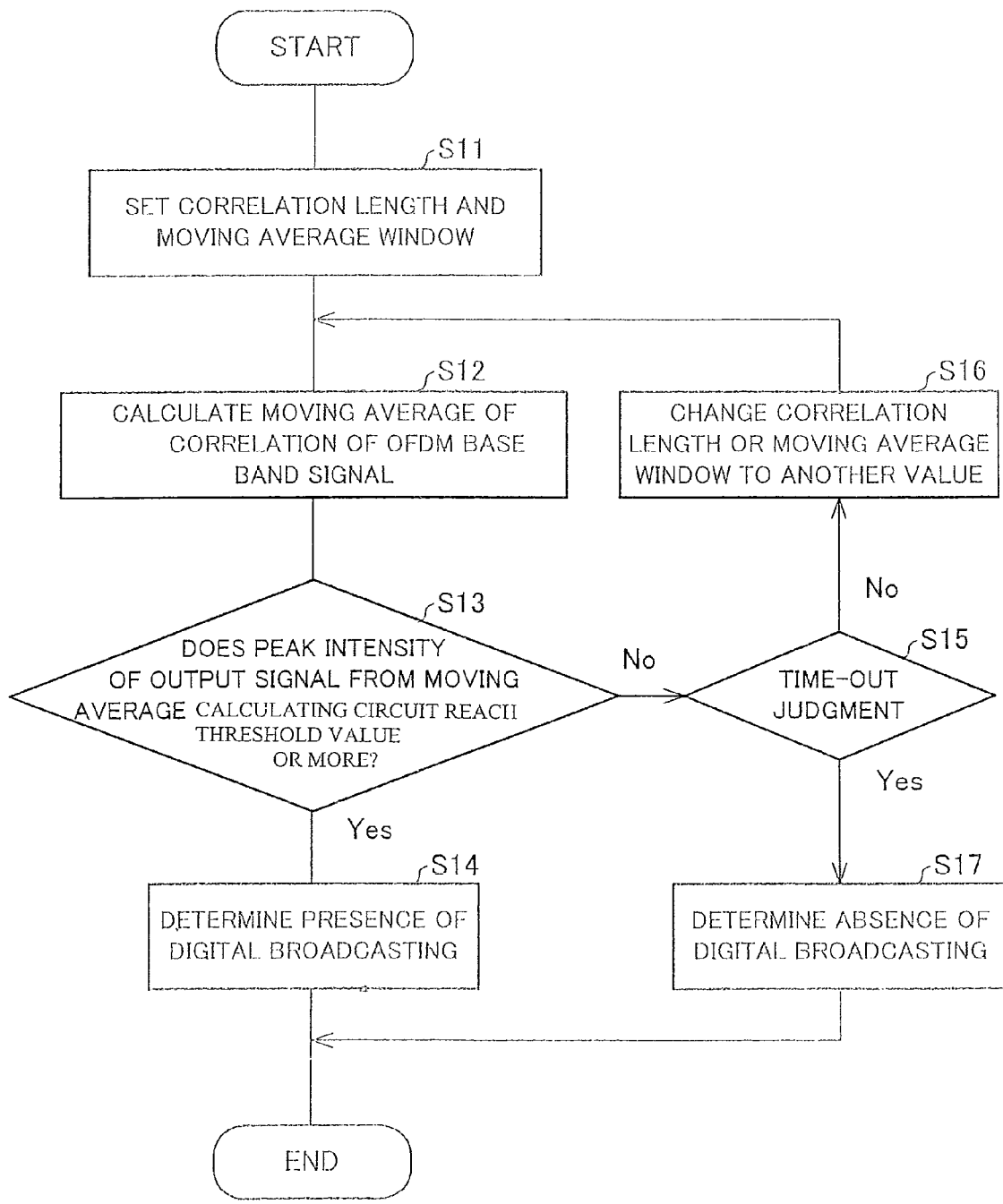
FIG. 9, relating to one embodiment of the present invention, is a flow chart illustrating one example of a "GI search process".

Here, the following describes, with reference to FIG. 9, a process flow of the "GI search process". FIG. 9, relating to one embodiment of the present invention, is a flow chart illustrating one example of the "GI search process".

Firstly, the correlation calculating circuit 51 sets a correlation length and a moving average window (S11). Note that the correlation length set herein is an effective period length $t_s$ defined by a mode arbitrarily selected. Then, the correlation calculating circuit 51 delays a base band OFDM signal by the effective symbol period length $t_s$. Then, the correlation calculating circuit 51 calculates a correlation between (i) the base band OFDM signal before the delay and (ii) the base band OFDM signal after the delay, so as to output, to the moving average calculating circuit 52, a value thus obtained.

Subsequently, the moving average calculating circuit 52 calculates a moving average value in accordance with the value outputted from the correlation calculating circuit 51 (S12). Then, the moving average calculating circuit 52 outputs a calculation result to the peak-position detecting circuit 53.

The peak-position detecting circuit 53 determines whether or not the peak (a peak intensity) of the moving average value reaches a predetermined threshold value or more, in accordance with the calculation result outputted from the moving average calculating circuit 52 (S13).

If the result is "YES" in Step S13, the peak-position detecting circuit 53 determines that the broadcast wave detected by the foregoing "RF search process" is a broadcast wave of digital broadcasting (S14). Then, the process is ended.

On the other hand, if the result is "NO" in Step S13, the peak-position detecting circuit 53 checks how much time has elapsed since the start of the "GI search process", thereby performing a time-out judgment (S15). Note that minimum time required to perform the "GI search process" is the time equivalent to two symbols (approximately 2 ms). Therefore, time set in Step S15 is equal to or more than two symbols. Note that it is sometimes difficult to detect a broadcast wave of digital terrestrial broadcast depending on the state of a radio wave. Therefore, it is preferable that time up to the time-out is set to, for example, approximately 20 ms, for the purpose of improving detection accuracy. The time varies depending on the performance of the whole system, including the antenna 11, the tuner 12, and the OFDM demodulation device 1. Therefore, it is preferable that the GI search control section 42 is arranged so as to be capable of setting a plurality of patterns of the GI search process time.

Here, if the peak-position detecting circuit 53 determines that the time is within the set time ("NO" in S15), the peak-position detecting circuit 53 instructs the correlation calculating circuit 51 to change the correlation length. In response to the instruction given by the peak-position detecting circuit 53, the correlation calculating circuit 51 changes the correlation length to an effective symbol period length $t_s$ defined by another mode (S16). Then, the moving average window used by the moving average calculating circuit 52 is caused to coincide with a GI period length which is assumed to be minimum in every mode. Subsequently, Step S12 and Step S13 are performed again.

On the other hand, if the result is "YES" in step S15, the peak-position detecting circuit 53 determines that there is no digital broadcasting in the selected channel (S17). Then, the process is ended.

As described above, the OFDM demodulation device 1 according to the present embodiment firstly performs the "RF search process" so as to determine whether or not there is a broadcast wave in a selected channel. If it is determined that there is the broadcast wave in the selected channel, the OFDM demodulation device 1 performs the "GI search process" in accordance with an output signal from the tuner 12 so as to determine whether or not the broadcast wave in the selected channel is a broadcast wave of digital broadcasting.

Here, the following description deals with time taken for performing a search on 50 channels so as to determine whether or not there is a digital broadcast wave in the 50 channels. Time required to perform the "RF search process" is approximately 500 μs to approximately 1 ms, and time required to perform the "GI search process" is, as described above, approximately 20 ms. Assume that it is determined, by means of the "GI search process" alone, whether or not there is a broadcast wave of digital terrestrial broadcasting in 50 channels. In this case, because the "GI search" takes 20 ms per channel, necessary search time for the 50 channels is 1 s.

On the other hand, consider a case where the "RF search process", which requires shorter process time than the "GI search", is performed alone so as to perform the determining. In this case, the necessary search time for the 50 channels is merely 50 ms. However, in this case, it is difficult to accurately determine whether or not there is a broadcast wave of digital terrestrial broadcasting in the channels. This is because, with this arrangement, it may be determined that there is a broadcast wave, not only in a case where a selected channel contains a broadcast wave of digital terrestrial broadcasting, but also in a case where the selected channel contains an analog broadcast wave or a noise.

In order to deal with this, as in the OFDM demodulation device 1 according to the present embodiment, the "RF search process" is firstly performed on every channel so that channels are narrowed down to the channels which are assumed to contain a broadcast wave. Then, the "GI search process" is performed on the channels thus narrowed down. This makes it possible to accurately determine whether or not there is a broadcast wave of digital terrestrial broadcasting in a selected channel. Further, because the "GI search process" is performed after the channels to be subjected to the "GI search process" are narrowed down by the "RF search process", it is possible to significantly reduce the process time compared with the case where the "GI search process" is performed alone. For example, in a case where the "RF search process" is firstly performed and as a result a broadcast wave is detected in 20 channels out of the 50 channels, the search time taken for the "GI search process" on the 20 channels is expressed by 20 ms×20=400 ms, and the total process time is 450 ms. Thus, detecting a digital broadcast wave by the combination of the "RF search process" and the "GI search process" reduces the process time to half or less of the process time (approximately 1 s) required when the detection is performed by the "GI search process" alone.

Figure 10:
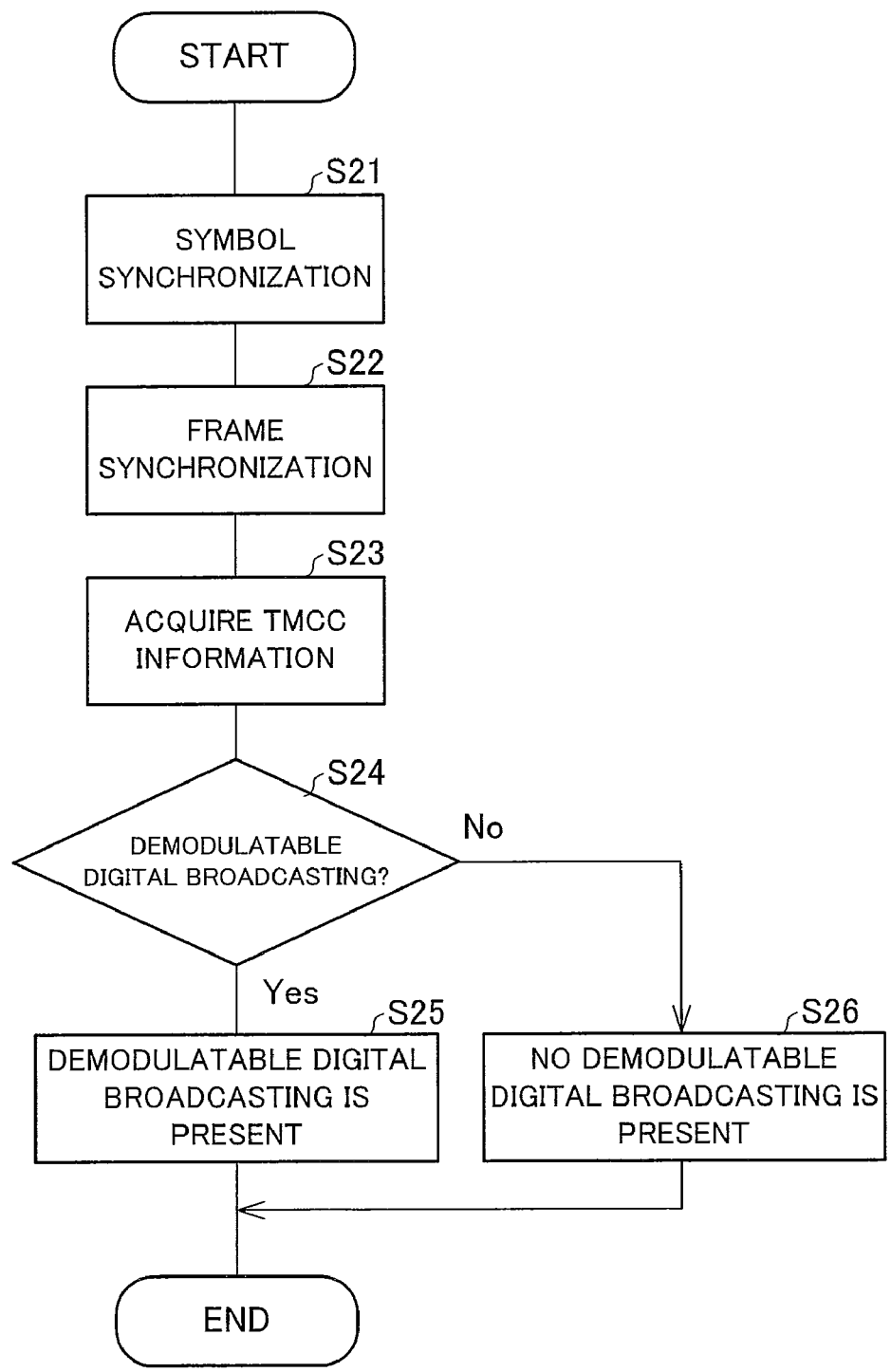
FIG. 10, relating to one embodiment of the present invention, is a flow chart illustrating a process flow of a "transmission control information search process".
Figures 11, 12:
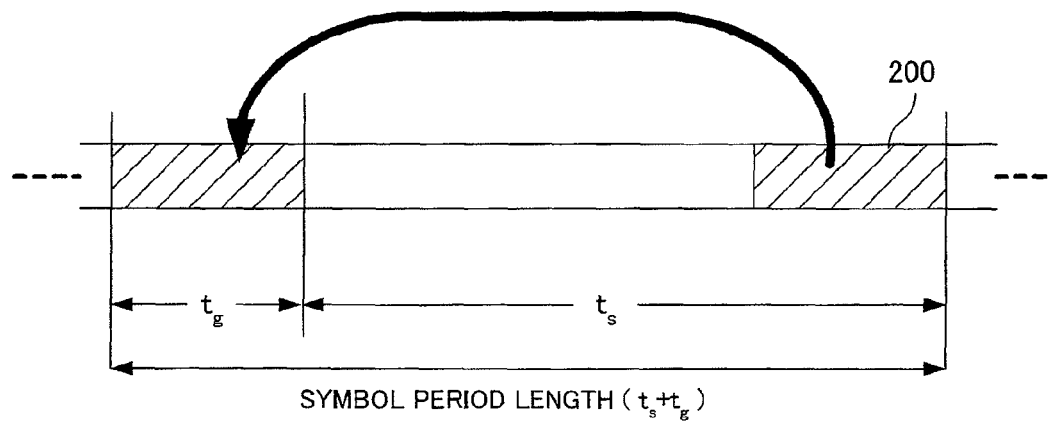
FIG. 11, relating to conventional art, illustrates an arrangement of a symbol period length of a transmission symbol.
FIG. 12, relating to conventional art, shows a relationship between (i) a type of mode and (ii) an effective symbol period length corresponding to the mode.

Further, the OFDM demodulation device 1 according to the present embodiment has the following arrangement: If the "search process" gives a result indicating that there is a broadcast wave of digital broadcasting in a selected channel, it is possible to perform the "transmission control information search process" (described later) so as to determine whether or not the broadcast wave is demodulatable by the OFDM demodulation device 1 (a demodulation judgment process). The following describes, with reference to FIG. 1 and FIG. 10, the "transmission control information search process" in detail. FIG. 10, relating to one embodiment of the present invention, is a flow chart illustrating a process flow of the "transmission control information search process".

(Transmission Control Information Search Process)

As described above, if the search process gives a result indicating that there is a broadcast wave of digital broadcasting in a selected channel, the transmission control information search control section 35 receives, from the GI search control section 42, a control signal for instructing the execution of the "transmission control information search process". Upon receipt of the control signal, the transmission control information search control section 35 receives TMCC information from the transmission control information decoding circuit 31. Then, by referring to a partial reception flag and/or the like contained in the TMCC information, the transmission control information search control section 35 determines whether the broadcast wave of the digital broadcasting is a broadcast signal of a 1-segment format or of a broadcast signal of a 3-segment format. Based on the determination result, the transmission control information search control section 35 determines whether or not the broadcast signal received is a broadcast signal which is demodulatable by the OFDM demodulation device 1.

The OFDM demodulation device 1 according to the present embodiment is a demodulation device for a broadcast signal of the 1-segment format. Therefore, if the determination result indicates that the broadcast signal is a broadcast signal of the 3-segment format, the transmission control information search control section 35 determines that the broadcast signal received is not a broadcast signal which is demodulatable by the OFDM demodulation device 1.

If the transmission control information search control section 35 determines that the broadcast signal received is a broadcast signal which is demodulatable by the OFDM demodulation device 1, the transmission control information search control section 35 stores, in the memory 37, information regarding the currently selected channel, as the search result information 60.

On the other hand, if the transmission control information search control section 35 determines that the broadcast signal received is not a broadcast signal which is demodulatable by the OFDM demodulation device 1, the transmission control information search control section 35 instructs the channel selecting circuit 32 to change the channel to a next channel.

Here, the following describes the process flow of the "transmission control information search process".

Firstly, as described above, the synchronization circuit 19 establishes a so-called symbol synchronization (S21) by (i) referring to a TMCC signal and the like contained in a base band OFDM signal which is inputted, (ii) working out a boundary of an OFDM symbol, and (iii) setting an operation start timing at which the FFT operation circuit 17 performs an FFT operation. Next, the synchronization circuit 19 establishes a so-called frame synchronization (S22) by (i) referring to a synchronization signal contained in the TMCC signal and (ii) specifying a front end of each frame i.e., a head symbol out of symbols constituting a frame.

Upon the establishment of the symbol synchronization and the frame synchronization, the transmission control information decoding circuit 31 decodes, in accordance with the transmission control information outputted from the frame extraction circuit 18, transmission control information (e.g., TMCC) which has been modulated to a predetermined position in an OFDM transmission frame.

In a case where the transmission control information search control section 35 has received, from the GI search control section 42, a control signal which instructs the execution of the "transmission control information search process", the transmission control information search control section 35 acquires the TMCC information from the transmission control information decoding circuit 31 (S23). Then, the transmission control information search control section 35 refers to a partial reception flag and/or the like contained in the TMCC information thus acquired. Thereby, the transmission control information search control section 35 determines whether the broadcast wave (determined by the "search process" as being received) of the digital broadcasting is a broadcast signal of the 1-segment format or a broadcast signal of a 3-segment format. Thus, the transmission control information search control section 35 determines whether or not the broadcast wave of the digital broadcasting is demodulatable by the OFDM demodulation device 1 (S24). If it is determined, in Step S24, that the broadcast wave of the digital broadcasting is demodulatable by the OFDM demodulation device 1 ("YES" in S24), the transmission control information search control section 35 determines that the currently selected channel contains demodulatable digital broadcasting (S25).

On the other hand, if it is determined, in Step S24, that the broadcast wave of the digital broadcasting is not demodulatable by the OFDM demodulation device 1 ("NO" in S24), the transmission control information search control section 35 determines that the currently selected channel does not contain demodulatable digital broadcasting (S26).

In the above-mentioned manner, it is possible for the transmission control information search control section 35 to determine whether or not there is demodulatable digital broadcasting in a selected channel. That is, it is possible for the OFDM demodulation device 1 according to the present embodiment to perform a search for a channel which search includes not only (i) determining whether or not there is a broadcast wave of digital broadcasting in a selected channel but also (ii) determining whether or not the broadcast wave is demodulatable by the OFDM demodulation device 1.

Described above is the arrangement where (i) the "RF search process" and the "GI search process" are performed in order and then (ii) the "transmission control information search process" is performed. However, the present invention is not limited to this. For example, the OFDM demodulation device 1 according to the present embodiment may be arranged so as to perform the "transmission control information search process" alone, or may be arranged so as to (i) perform either one of the "RF search process" or the "GI search process" and then (ii) perform the "transmission control information search process".

However, because the frame synchronization and the transmission control information extraction are performed in the "transmission control information search process", the "transmission control information search process" requires the search time of approximately 300 ms to approximately 600 ms per channel. Therefore, in a case where a search for a broadcast wave of digital broadcasting is performed in a plurality of channels, performing the search with such an arrangement that the "transmission control information search process" is performed after either one of the "RF search process" or the "GI search process" is performed improves processing efficiency. Note that the "RF search process" and the "GI search process" have shorter process time than the "transmission control information search process". Therefore, this arrangement reduces the number of channels to be subjected to the "transmission control information search process", thereby improving processing efficiency.

Further, the OFDM demodulation device 1 according to the present embodiment described above is arranged so as to perform the "search process" in response to an instruction given by a user. Furthermore, instead of this, the OFDM demodulation device 1 according to the present embodiment may be arranged so as to perform the "search process" automatically at a start-up or the like of the broadcast wave receiving system 100.

Especially, it is possible for the OFDM demodulation device 1 according to the present embodiment to quickly search for a channel from which a broadcast wave of digital terrestrial broadcasting is receivable. Therefore, the OFDM demodulation device 1 according to the present embodiment does not cause a user to feel inconvenience even if a search for a channel is set to be performed at a start-up as described above. Further, by setting a search for a channel to be performed automatically as described above, it is possible to reduce the number of times that a user gives an instruction for performing the search process.

As described above, a demodulation device according to the present invention includes the below-described arrangement. Further, a method according to the present invention for controlling the demodulation device includes the below-described steps.

That is, a demodulation device according to the present invention is a demodulation device for demodulating a digital broadcast wave, which is a broadcast wave of digital terrestrial broadcasting, the digital broadcast wave being received by a tuner section, said demodulation device, including: broadcast wave determining means for determining whether or not there is a broadcast wave in a certain channel, in accordance with an intensity of a signal outputted from the tuner section; and digital broadcast wave determining means for determining, in a case where the broadcast wave determining means determines that there is a broadcast wave in the certain channel, whether or not the broadcast wave is a digital broadcast wave, the determining being made in accordance with the signal outputted from the tuner section.

Accordingly, it is possible for the demodulation device according to the present invention to efficiently search for a channel containing a digital broadcast wave.

Further, it is preferable that the demodulation device according to the present invention is arranged so that, while the intensity of the signal outputted from the tuner section reaches a predetermined threshold value or more, the broadcast wave determining means determines that there is a broadcast wave in the certain channel.

Incidentally, in a case where there is a broadcast wave in a certain channel, it is possible to obtain a signal having a higher intensity than an intensity of a signal outputted due to an electromagnetic noise or the like generated by, for example, an electronic device or the like.

Here, for example, the predetermined threshold value may be set to be within a range allowing (i) an intensity of a signal outputted from the tuner section due to a noise or the like to be distinguished from (ii) an intensity of an signal outputted from the tuner section due to a broadcast wave. Thereby, it is possible for the broadcast wave determining means to determine whether or not a signal received by the tuner section is the one outputted due to a broadcast wave.

Furthermore, it is preferable that the demodulation device according to the present invention is arranged so that, in a case where the intensity of the signal outputted from the tuner section is integrated for a predetermined period and reaches a predetermined threshold value or more, the broadcast wave determining means determines that there is a broadcast wave in the certain channel.

Incidentally, in a case where there is a broadcast wave in a certain channel, it is possible to obtain a signal having a higher intensity than an intensity of a signal outputted due to a noise or the like. Further, an integral value obtained by integrating an intensity of the signal for a predetermined integral period is greater than an integral value obtained in a case where there is no broadcast wave in the certain channel.

Here, for example, the predetermined threshold value may be set to be within a range allowing (i) an integral value obtained by integrating an intensity of a signal outputted from the tuner section due to a noise or the like to be distinguished from (ii) an integral value obtained by integrating an intensity of a signal outputted from the tuner section due to the broadcast wave. Thereby, it is possible for the broadcast wave determining means to determine whether or not a signal received by the tuner section is the one outputted due to a broadcast wave.

Further, the broadcast wave determining means determines whether or not there is a broadcast wave in a certain channel, in accordance with whether or not an integral value obtained by integrating an intensity of a signal for a predetermined period reaches a predetermined threshold value or more. With this arrangement, even in a case where a noise having an intensity similar to an intensity of a broadcast wave signal instantly occurs, it is possible to prevent such a situation that the noise is wrongly determined as a broadcast wave.

Moreover, the demodulation device according to the present invention may be arranged so as to further include: an automatic gain control section for performing an output gain control on the tuner section so that the tuner section has a constant output; and gain setting means for causing the automatic gain control section to stop the output gain control, and for causing the automatic gain control section to set an output gain of the tuner section so that the tuner section has a greater output than the output obtained while the tuner section is subjected to the output gain control by the automatic gain control section, the broadcast wave determining means determining that there is a broadcast wave in the certain channel, while the intensity of the signal, outputted from the tuner section in accordance with the output gain to which the gain setting means causes the automatic gain control section to set, reaches a predetermined threshold value or more.

According to this arrangement, because the demodulation device includes the gain setting means, it is possible to amplify an intensity of a signal outputted from the tuner section so that the intensity of the signal obtains a greater value than a value obtained in a case where the AGC is performed so that the tuner section has a constant output. Further, the broadcast wave determining means determines whether or not there is a broadcast wave in a certain channel, in accordance with the intensity thus amplified. This reduces time taken for the determining process. Furthermore, even in a case where the demodulation device according to the present invention is at a place where reception sensitivity for a broadcast wave is poor, it is possible to determine whether or not there is a broadcast wave in a certain channel. This is because with this arrangement a signal outputted from the tuner section is amplified so that its intensity is greater than an intensity obtained while the AGC is performed.

Furthermore, the demodulation device according to the present invention may be arranged so as to further include: an automatic gain control section for performing an output gain control on the tuner section so that the tuner section has a constant output; and gain setting means for causing the automatic gain control section to stop the output gain control, and for causing the automatic gain control section to set an output gain of the tuner section so that the tuner section has a greater output than the output obtained while the tuner section is subjected to the output gain control by the automatic gain control section, the broadcast wave determining means determining that there is a broadcast wave in the certain channel, in a case where the intensity of the signal, outputted from the tuner section in accordance with the output gain to which the gain setting means causes the automatic gain control section to set, is integrated for a predetermined period and reaches a predetermined threshold value or more.

According to this arrangement, because the demodulation device includes the gain setting means, it is possible to amplify a signal outputted from the tuner section so that the signal obtains a greater value than a value obtained in a case where the AGC is performed so that the tuner section has a constant output. Further, the broadcast wave determining means determines whether or not there is a broadcast wave in a certain channel, in accordance with an integral value obtained by integrating the intensity thus amplified. This reduces time taken for the determining process. Furthermore, even in a case where the demodulation device according to the present invention is at a place where reception sensitivity for a broadcast wave is poor, it is possible to determine whether or not there is a broadcast wave in a certain channel. This is because with this arrangement a signal outputted from the tuner section is amplified so that its intensity is greater than an intensity obtained while the AGC is performed.

Moreover, the broadcast wave determining means is arranged so as to determine whether or not there is a broadcast wave in a certain channel, in accordance with whether or not an integral value obtained by integrating an intensity of a signal for a predetermined period reaches a predetermined threshold value or more. With this arrangement, even in a case where a noise having an intensity similar to an intensity of a signal of broadcast wave instantly occurs, it is possible to prevent such a situation that the noise is wrongly determined as a broadcast wave.

Furthermore, it is preferable that the demodulation device according to the present invention is arranged so that: the digital broadcast wave is transmitted by an orthogonal frequency division multiplexing method utilizing a transmission symbol including an effective symbol and a guard interval containing a repetition of a part of the effective symbol; and the digital broadcast wave determining means determines whether or not the broadcast wave is a digital broadcast wave, based on whether or not a change is present in a moving average value of a correlation with respect to the signal outputted from the tuner section, the moving average value being calculated using a period length of the guard interval as a moving average window.

For example, according to a standard such as the one prescribed by the ISDB-T, a symbol period length of a transmission symbol includes an effective symbol period and a guard interval period, and a signal waveform for the guard interval period is a repetition of a signal waveform for a certain end segment of the effective symbol period. Thus, in a case where a signal outputted from the tuner section is a broadcast wave of digital broadcasting, the broadcast wave includes a guard interval period. Therefore, in a case where a broadcast wave detected is a digital broadcast wave, a moving average value (calculated using a guard interval period length as a moving average window) of a correlation with respect to a signal outputted from the tuner section attains a significant value in a certain end segment of an effective symbol period which certain end segment correlates with the moving average window. Thereby, a change occurs in the moving average value.

Therefore, in a case where a change occurs in a moving average value of a correlation with respect to a signal outputted from the tuner section which moving average value is calculated using a guard interval period length as a moving average window, the demodulation device according to the present invention determines that there is a broadcast wave of digital broadcasting in a certain channel. Here, with time equivalent to at least two transmission symbols, it is possible for the digital broadcast wave determining means to determine whether or not there is a broadcast wave of digital broadcasting in the certain channel.

Thus, the demodulation device according to the present invention efficiently determines whether or not there is a digital broadcast wave in a certain channel, based on whether or not a signal outputted from the tuner section contains a guard interval period.

Further, as described above, the demodulation device according to the present invention is a demodulation device for demodulating a digital broadcast wave transmitted by an orthogonal frequency division multiplexing method utilizing a transmission symbol including an effective symbol and a guard interval containing a repetition of a part of the effective symbol, the digital broadcast wave being received by a tuner section, said demodulation device, including: digital broadcast wave determining means for determining whether or not there is a digital broadcast wave in a certain channel, based on whether or not a change is present in a moving average value of a correlation with respect to a signal outputted from the tuner section, the moving average value being calculated using a period length of the guard interval as a moving average window.

Accordingly, it is possible for the demodulation device according to the present invention to efficiently determine whether or not there is a digital broadcast wave in a certain channel, based on whether or not a signal outputted from the tuner section contains a guard interval period.

Furthermore, the demodulation device according to the present invention may be arranged so as to further include: an acquiring section for acquiring, from a transmission control signal of the digital broadcast wave, transmission control information concerning transmission control of the digital terrestrial broadcasting, the transmission control signal being contained in the signal outputted from the tuner section; and demodulation determining means for determining, in a case where the digital broadcast wave determining means determines that there is a digital broadcast wave in the certain channel, whether or not the digital broadcast wave is demodulatable by the demodulation device, the determining being made in accordance with the transmission control information acquired by the acquiring section.

The transmission control information may be, for example, TMCC information in a broadcast wave of digital terrestrial broadcasting.

According to this arrangement, because the demodulation device includes the demodulation determining means, it is possible to determine, in the following manner, whether or not a digital broadcast wave is demodulatable by the demodulation device: For example, in a case where transmission control information is TMCC information, a partial reception flag contained in the information is referred to, and thereby it is determined whether the digital broadcast wave is a broadcast signal of a 1-segment format or a broadcast signal of a 3-segment format. Thus, it is determined whether or not the digital broadcast wave is demodulatable by the demodulation device.

As described above, it is possible for the demodulation device according to the present invention to determine, by referring to the transmission control information, whether or not a digital broadcast wave is demodulatable by the demodulation device. This allows for, for example, omission of a process for (i) associating, with a channel, a digital broadcast wave which is not demodulatable by the demodulation device and then (ii) registering the digital broadcast wave which is not demodulatable.

Furthermore, as described above, a method according to the present invention for controlling the demodulation device is a method of controlling a demodulation device for demodulating a digital broadcast wave, which is a broadcast wave of digital terrestrial broadcasting, the digital broadcast wave being received by a tuner section, said method including the steps of: (a) determining whether or not there is a broadcast wave in a certain channel, in accordance with an intensity of a signal outputted from the tuner section; and (b) determining, in a case where the step (a) determines that there is a broadcast wave in the certain channel, whether or not the broadcast wave is a digital broadcast wave, the determining being made in accordance with the signal outputted from the tuner section.

Accordingly, it is possible for the method according to the present invention for controlling the demodulation device to efficiently search for a channel containing a digital broadcast wave.

Furthermore, as described above, the method according to the present invention for controlling the demodulation device is a method of controlling a demodulation device for demodulating a digital broadcast wave transmitted by an orthogonal frequency division multiplexing method utilizing a transmission symbol including an effective symbol and a guard interval containing a repetition of a part of the effective symbol, the digital broadcast wave being received by a tuner section, said method including the step of: (a) determining whether or not there is a digital broadcast wave in a certain channel, based on whether or not a change is present in a moving average value of a correlation with respect to a signal outputted from the tuner section, the moving average value being calculated using a period length of the guard interval as a moving average window.

Accordingly, it is possible for the method according to the present invention for controlling the demodulation device to efficiently determine whether or not there is a digital broadcast wave in a certain channel, based on whether or not a signal outputted from the tuner section contains a guard interval period.

The demodulation device may be realized by a computer. In this case, the present invention may encompass (i) a control program for the demodulation device which control program causes a computer to function as each means and thereby realizes the demodulation device by the computer and (ii) a computer-readable storage medium storing the control program.

The present invention is not limited to the description of the embodiments above, but may be altered by a skilled person within the scope of the claims. An embodiment based on a proper combination of technical means disclosed in different embodiments is encompassed in the technical scope of the present invention.

Finally, the blocks of the OFDM demodulation device 1, especially the RF search control section 41, the GI search control section 42, and the transmission control information search control section 35 may be realized by way of hardware or software as executed by a CPU as follows:

The OFDM demodulation device 1 includes a CPU (central processing unit) and memory devices (memory media). The CPU (central processing unit) executes instructions in control programs realizing the functions. The memory devices include a ROM (read only memory) which contains programs, a RAM (random access memory) to which the programs are loaded, and a memory containing the programs and various data. The objective of the present invention can also be achieved by mounting to the OFDM demodulation device 1 a computer-readable storage medium containing control program code (executable program, intermediate code program, or source program) for the OFDM demodulation device 1, which is software realizing the aforementioned functions, in order for the computer (or CPU, MPU) to retrieve and execute the program code contained in the storage medium.

The storage medium may be, for example, a tape, such as a magnetic tape or a cassette tape; a magnetic disk, such as a Floppy (Registered Trademark) disk or a hard disk, or an optical disk, such as CD-ROM/MO/MD/DVD/CD-R; a card, such as an IC card (memory card) or an optical card; or a semiconductor memory, such as a mask ROM/EPROM/EEPROM/flash ROM.

The OFDM demodulation device 1 may be arranged to be connectable to a communications network so that the program code may be delivered over the communications network. The communications network is not limited in any particular manner, and may be, for example, the Internet, an intranet, extranet, LAN, ISDN, VAN, CATV communications network, virtual dedicated network (virtual private network), telephone line network, mobile communications network, or satellite communications network. The transfer medium which makes up the communications network is not limited to the ISDB-T system of Japan, and may be, for example, a digital terrestrial broadcasting system such as the DVB system of Europe or the ATSC system of the U.S.A., or other transfer medium. The "other transfer medium" may encompass: wired line, such as IEEE 1394, USB, electric power line, cable TV line, telephone line, or ADSL line; or wireless, such as infrared radiation (IrDA, remote control), Bluetooth (Registered Trademark), 802.11 wireless, HDR, mobile telephone network, satellite line, or terrestrial digital network. The present invention encompasses a carrier wave or data signal transmission in which the program code is embodied electronically. The present invention encompasses a carrier wave or data signal transmission in which the program code is embodied electronically.

Industrial Applicability

The OFDM demodulation device 1 according to the present embodiment is capable of quickly and accurately searching for a broadcast wave of digital broadcasting which is receivable. Therefore, for example, a digital broadcast receiving device such as a portable device provided with the OFDM demodulation device 1 is capable of quickly searching for a channel from which a broadcast wave is receivable and providing services to a user, even in a case where the digital broadcast receiving device is moved with the user.

The invention claimed is:

1. A demodulation device for demodulating a digital broadcast wave, which is a broadcast wave of digital terrestrial broadcasting, the digital broadcast wave being received by a tuner section, said demodulation device comprising: broadcast wave determining means for determining whether or not there is a broadcast wave in a certain channel, in accordance with an intensity of a signal outputted from the tuner section; digital broadcast wave determining means for determining, in a case where the broadcast wave determining means determines that there is a broadcast wave in the certain channel, whether or not the broadcast wave is a digital broadcast wave, the determining being made in accordance with the signal outputted from the tuner section; an automatic gain control section for performing a primary output gain control on the tuner section so that the tuner section has a constant output; and gain setting means for causing the automatic gain control section to stop the-the primary output gain control, and for causing the automatic gain control section to set an-a secondary output gain of the tuner section so that the tuner section has a greater output than the output obtained while the tuner section is subjected to the primary output gain control by the automatic gain control section, wherein the broadcast wave determining means determines that there is a broadcast wave in the certain channel, when the intensity of the signal, which is outputted from the tuner section in accordance with the secondary output gain to which the gain setting means causes the automatic gain control section to set, reaches a predetermined threshold value or more, and the secondary output gain is a maximum amplifiable value of the tuner section.

2. The demodulation device as set forth in claim 1, wherein:
   the digital broadcast wave is transmitted by an orthogonal frequency division multiplexing method utilizing a transmission symbol including an effective symbol and a guard interval containing a repetition of a part of the effective symbol; and
   the digital broadcast wave determining means determines whether or not the broadcast wave is a digital broadcast wave, based on whether or not a change is present in a moving average value of a correlation with respect to the signal outputted from the tuner section, the moving average value being calculated using a period length of the guard interval as a moving average window.

3. The demodulation device as set forth in claim 2, further comprising:
   an acquiring section for acquiring, from a transmission control signal of the digital broadcast wave, transmission control information concerning transmission control of digital broadcasting, the transmission control signal being contained in the signal outputted from the tuner section; and
   demodulation determining means for determining, in a case where the digital broadcast wave determining means determines that there is a digital broadcast wave in the certain channel, whether or not the digital broadcast wave is demodulatable by the demodulation device, the determining being made in accordance with the transmission control information acquired by the acquiring section.

4. A non-transitory computer-readable storage medium storing a control program for causing a demodulation device as set forth in claim 1 to operate, the control program causing a computer to function as each means of said demodulation device.

5. The demodulation device of claim 1, wherein the secondary output gain is a fixed value which is greater than a gain value obtained during the primary output gain control.

6. The demodulation device of claim 5, wherein the secondary output gain is a maximum amplifiable value of the tuner section.

7. A demodulation device for demodulating a digital broadcast wave, which is a broadcast wave of digital terrestrial broadcasting, the digital broadcast wave being received by a tuner section, said demodulation device comprising: broadcast wave determining means for determining whether or not there is a broadcast wave in a certain channel, in accordance with an intensity of a signal outputted from the tuner section; digital broadcast wave determining means for determining, in a case where the broadcast wave determining means determines that there is a broadcast wave in the certain channel, whether or not the broadcast wave is a digital broadcast wave, the determining being made in accordance with the signal outputted from the tuner section; an automatic gain control section for performing a primary output gain control on the tuner section so that the tuner section has a constant output; and gain setting means for causing the automatic gain control section to stop the primary output gain control, and for causing the automatic gain control section to set a secondary output gain of the tuner section so that the tuner section has a greater output than the output obtained while the tuner section is subjected to the primary output gain control by the automatic gain control section, wherein the broadcast wave determining means determining determines that there is a broadcast wave in the certain channel in a case where the intensity of the signal, which is outputted from the tuner section in accordance with the secondary output gain to which the gain setting means causes the automatic gain control section to set, is integrated for a predetermined period and reaches a predetermined threshold value or more, and the secondary output gain is a maximum amplifiable value of the tuner section.

8. The demodulation device as set forth in claim 7, wherein:
the digital broadcast wave is transmitted by an orthogonal frequency division multiplexing method utilizing a transmission symbol including an effective symbol and a guard interval containing a repetition of a part of the effective symbol; and
the digital broadcast wave determining means determines whether or not the broadcast wave is a digital broadcast wave, based on whether or not a change is present in a moving average value of a correlation with respect to the signal outputted from the tuner section, the moving average value being calculated using a period length of the guard interval as a moving average window.

9. The demodulation device as set forth in claim 8, further comprising:
an acquiring section for acquiring, from a transmission control signal of the digital broadcast wave, transmission control information concerning transmission control of digital broadcasting, the transmission control signal being contained in the signal outputted from the tuner section; and
demodulation determining means for determining, in a case where the digital broadcast wave determining means determines that there is a digital broadcast wave in the certain channel, whether or not the digital broadcast wave is demodulatable by the demodulation device, the determining being made in accordance with the transmission control information acquired by the acquiring section.

10. A non-transitory computer-readable storage medium storing a control program for causing a demodulation device as set forth in claim 7 to operate, the control program causing a computer to function as each means of said demodulation device.

11. A method of controlling a demodulation device for demodulating a digital broadcast wave, which is a broadcast wave of digital terrestrial broadcasting, the digital broadcast wave being received by a tuner section, the demodulation device including an automatic gain control section performing a primary output gain control on the tuner section so that the tuner section has a constant output, said method comprising the steps of: (a) determining whether or not there is a broadcast wave in a certain channel, in accordance with an intensity of a signal outputted from the tuner section; (b) determining, in a case where the step (a) determines that there is a broadcast wave in the certain channel, whether or not the broadcast wave is a digital broadcast wave, the determining being made in accordance with the signal outputted from the tuner section; and (c) causing the automatic gain control section to stop the primary output gain control, and causing the automatic gain control section to set a secondary output gain of the tuner section so that the tuner section has a greater output than the output obtained while the tuner section is subjected to the primary output gain control by the automatic gain control section, the step (a) determining that there is a broadcast wave in the certain channel when the intensity of the signal, which is outputted from the tuner section in accordance with the secondary output gain to which the step (c) causes the automatic gain control section to set, reaches a predetermined threshold value or more, and the secondary output gain is a maximum amplifiable value of the tuner section.

12. A method of controlling a demodulation device for demodulating a digital broadcast wave, which is a broadcast wave of digital terrestrial broadcasting, the digital broadcast wave being received by a tuner section, the demodulation device including an automatic gain control section performing a primary output gain control on the tuner section so that the tuner section has a constant output, said method comprising the steps of: (a) determining whether or not there is a broadcast wave in a certain channel, in accordance with an intensity of a signal outputted from the tuner section; (b) determining, in a case where the step (a) determines that there is a broadcast wave in the certain channel, whether or not the broadcast wave is a digital broadcast wave, the determining being made in accordance with the signal outputted from the tuner section; (c) causing the automatic gain control section to stop the primary output gain control, and causing the automatic gain control section to set a secondary output gain of the tuner section so that the tuner section has a greater output than the output obtained while the tuner section is subjected to the primary output gain control by the automatic gain control section, the step (a) determining that there is a broadcast wave in the certain channel in a case where the intensity of the signal, which is outputted from the tuner section in accordance with the secondary output gain to which the step (c) causes the automatic gain control section to set, is integrated for a predetermined period and reaches a predetermined threshold value or more, and the secondary output gain is a maximum amplifiable value of the tuner section.

* * * * *